US008386187B2

(12) United States Patent
Otvos

(10) Patent No.: US 8,386,187 B2
(45) Date of Patent: Feb. 26, 2013

(54) LIPOPROTEIN INSULIN RESISTANCE INDEXES AND RELATED METHODS, SYSTEMS AND COMPUTER PROGRAMS FOR GENERATING SAME

(75) Inventor: James D. Otvos, Apex, NC (US)

(73) Assignee: LipoScience, Inc., Raleigh, NC (US)

( * ) Notice: Subject to any disclaimer, the term of this patent is extended or adjusted under 35 U.S.C. 154(b) by 514 days.

(21) Appl. No.: 12/582,259

(22) Filed: Oct. 20, 2009

(65) Prior Publication Data

US 2010/0100334 A1 Apr. 22, 2010

Related U.S. Application Data

(60) Provisional application No. 61/106,833, filed on Oct. 20, 2008.

(51) Int. Cl.
*G06F 19/00* (2011.01)
(52) U.S. Cl. ........... 702/19; 600/309; 600/310; 514/5.9; 436/71; 436/63; 436/13; 436/173
(58) Field of Classification Search ............. 702/19; 600/309, 310; 514/5.9; 436/71, 13, 63, 173
See application file for complete search history.

(56) References Cited

U.S. PATENT DOCUMENTS

| | | | |
|---|---|---|---|
| 4,933,844 A | 6/1990 | Otvos | |
| 5,343,389 A * | 8/1994 | Otvos | 436/173 |
| 6,518,069 B1 * | 2/2003 | Otvos et al. | 436/173 |
| 6,617,167 B2 * | 9/2003 | Otvos et al. | 436/71 |
| 6,890,905 B2 * | 5/2005 | Demuth et al. | 514/5.9 |
| 7,243,030 B2 | 7/2007 | Reeve et al. | |
| 7,259,018 B2 * | 8/2007 | Benner et al. | 436/71 |
| 7,369,952 B2 * | 5/2008 | Petrich et al. | 702/76 |
| 7,371,384 B2 * | 5/2008 | Gerber et al. | 424/145.1 |
| 7,395,158 B2 * | 7/2008 | Monfre et al. | 702/19 |
| 7,592,180 B2 * | 9/2009 | Amata et al. | 436/63 |
| 7,713,744 B2 * | 5/2010 | Benner et al. | 436/71 |
| 7,851,224 B2 * | 12/2010 | Benner et al. | 436/71 |
| 7,927,878 B2 * | 4/2011 | Kremer et al. | 436/71 |
| 8,013,602 B2 * | 9/2011 | Otvos et al. | 324/309 |
| 8,097,462 B2 * | 1/2012 | Benner et al. | 436/71 |
| 2003/0119194 A1 * | 6/2003 | Otvos | 436/71 |
| 2005/0222504 A1 * | 10/2005 | Otvos et al. | 600/410 |
| 2006/0073097 A1 * | 4/2006 | Ma et al. | 424/9.1 |
| 2006/0093606 A1 * | 5/2006 | Gerber et al. | 424/145.1 |
| 2007/0036787 A1 * | 2/2007 | Asfari et al. | 424/145.1 |
| 2007/0264677 A1 * | 11/2007 | Otvos | 435/11 |
| 2008/0066526 A1 * | 3/2008 | Amata et al. | 73/53.01 |
| 2008/0213794 A1 * | 9/2008 | Thadhani et al. | 435/7.1 |
| 2008/0280376 A1 * | 11/2008 | Handberg | 436/501 |
| 2009/0155826 A1 * | 6/2009 | Hu et al. | 435/11 |
| 2009/0191576 A1 * | 7/2009 | Ma et al. | 435/11 |
| 2011/0295517 A1 * | 12/2011 | Otvos et al. | 702/19 |

FOREIGN PATENT DOCUMENTS

EP 1645877 A1 * 4/2006
WO WO2006/110082 10/2006

OTHER PUBLICATIONS

Circulation 2005;111;3465-3472.*
Festa, Andreas et al., Nuclear Magnetic Resonance Lipoprotein Abnormalities in Prediabetic Subjects in the Insulin Resistance Atherosclerosis Study, Circulation, 2005, pp. 3465-3472, vol. 111.

(Continued)

*Primary Examiner* — Carol Tsai
(74) *Attorney, Agent, or Firm* — Myers Bigel Sibley & Sajovec, P.A.

(57) ABSTRACT

Methods, reports and systems for generating insulin resistance indexes for assessing decreased insulin sensitivity and/or levels of insulin resistance using a plurality of different measured lipoprotein particle parameters.

29 Claims, 8 Drawing Sheets

OTHER PUBLICATIONS

Howard, Barbara V., Insulin Resistance and Lipid Metabolism, Am J Cardiol, 1999, pp. 28J-32J, vol. 84.

International Search Report and Written Opinion for corresponding PCT application No. PCT/US2009/005689, Date of mailing Jun. 29, 2010.

Abate, Nicola, et al., "Abnormal cholesterol distribution among lipoprotein fractions in normolipidemic patients with mild NIDDM," *Atherosclerosis*, 1995, pp. 111-122, vol. 118.

Austin, Melissa A., et al., "Prospective Study of Small LDLs as a Risk Factor for Non-Insulin Dependent Diabetes Mellitus in Elderly Men and Women," *Circulation*, 1995, pp. 1770-1778, vol. 92, (http://circ.ahajournals.org/cgi/content/full/92/7/1770, pp. 1 to 21).

Austin, Melissa A., et al., "Small, dense low density lipoproteins, the insulin resistance syndrome and noninsulin-dependent diabetes," *Current Opinion in Lipidology*, 1996, pp. 167-171, vol. 7.

Betteridge, D.J., "Diabetic dyslipidaemia: treatment implications," *Journal of Internal Medicine*, 1994, pp. 47-52, vol. 236, Suppl. 736.

Bloomgarden, Zachary T., "Insulin Resistance: Current Concepts," *Clinical Therapeutics*, 1998, pp. 216-231, vol. 20, No. 2.

Breda, Elena, et al., "Insulin Release in Impaired Glucose Tolerance," *Diabetes*, Feb. 2002, pp. S227-S223, vol. 51, Supplement 1.

Calles-Escanson, Jorge, "Type 2 diabetes: one disease, multiple cardiovascular risk factors," *Coronary Artery Disease*, 1999, pp. 23-30, vol. 10, No. 1.

Coresh, Josef, "Association of plasma triglyceride concentration and LDL particle diameter, 17density, and chemical composition with premature coronary artery disease in men and women," *J18ournal of Lipid Research*, 1993, pp. 1687-1697, vol. 34.

Garg, Abhimanyu, "Treatment of Diabetic Dyslipidemia," *The American Journal of Cardiology*, 1998, pp. 47B-51B, vol. 81, No. 4A.

Garvey, Timothy W., et al., "Clinical Implications of the Insulin Resistance Syndrome," *Diabetes: Clinical Cornerstone*, 1998, pp. 13-28, vol. 1, No. 3.

Garvey, Timothy W., et al., "Effects of Insulin Resistance and Type 2 Diabetes on Lipoprotein Subclass Particle Size and Concentration Determined by Nuclear Magnetic Resonance," *Diabetes*, Feb. 2003, pp. 453-462, vol. 52.

Goff, D.C. Jr., et al., "Insulin Resistance and Adiposity Influence Lipoprotein Size and Subclass Concentrations. Results from the Insulin Resistance Atherosclerosis Study," *Metalbolism*, Feb. 2005, pp. 264-270, vol. 54, Issue 2.

Gray, Stuart R., et al., "Relation of LDL Size to the Insulin Resistance Syndrome and Coronary Heart Disease in American Indians," *Arteriosclerosis, Thrombosis, and Vascular Biology*, Nov. 1997, pp. 2713-2720, vol. 17, No. 11.

Haffner, Steven M., "Risk Factors for Non-insulin-dependent Diabetes Mellitus," *Journal of Hypertension*, 1995, pp. S73-S76, vol. 13, Suppl. 2.

Howard, Barbara V., "Insulin, Insulin Resistance, and Dyslipidemia," *Annals New York Academy of Sciences*, Dec. 17, 2006, pp. 1-8.

Kreisberg, Robert A., "Diabetic dyslipidemia," *The American Journal of Cardiology*, Dec. 17, 1998, pp. 67U-73U, vol. 82, Issue 12, Suppl. 1, (via Elsevier Science Direct).

Laakso, Markku, et al., "Insulin Resistance is Associated with Lipid and Lipoprotein Abnormalities in Subjects with Varying Degrees of Glucose Tolerance," *Arteriosciersosis*, Mar./Apr. 1990, pp. 223-231, vol. 10 (via atvb.ahajournals.org).

McLaughlin, Tracey, et al., "Use of Metabolic Markers to Identify Overweight Individuals Who Are Insulin Resistant," *Annals of Internal Medicine*, Nov. 18, 2003, pp. 802-809, vol. 139, No. 10.

O'Brien, T., et al., "HDL subparticles and coronary artery disease in NIDDM," *Atherosclerosis*, 1996, pp. 285-291, vol. 121.

Sowers, James R., et al., "Hyperinsulinemia, Insulin Resistance, and Hyperglycemia: Contributing Factors in the Pathogenesis of Hypertension and Atherosclerosis," *The American Journal of Hypertension*, Jul. 1993, pp. 260S-270S, vol. 6, No. 7, Part 2.

Stern, Michael P., "Perspectives in Diabetes: Diabetes and Cardiovascular Disease The "Common Soil" Hypothesis," Diabetes, Apr. 1995, pp. 369-374, vol. 44.

Taskinen, M.R., et al., "Lipid disorders in NIDDM; implications for treatment," *Journal of Internal Medicine*, 1998, pp. 361-370, vol. 244.

Tilly-Kiesi, Marju, et al., "Hyperinsulinemia and insulin resistance are associated with multiple abnormalities of lipoprotein subclasses in glucose-tolerant relatives of NIDDM patients," *Journal of Lipid Research*, 1996, pp. 1569-1578, vol. 37.

Uusitupa, M.I.J., et al., "Ten-year cardiovascular mortality in relation to risk factors and abnormalities in lipoprotein composition in Type 2 (non-insulin-dependent) diabetic and non-diabetic subjects," *Diabetologia*, 1993, pp. 1175-1184, vol. 36.

Zenobi, P.D., et al., "Improvement of lipid profile in Type 2 (non-insulin-dependent) diabetes mellitus by insulin-like growth factor I," *Diabetologia*, 1993, pp. 465-469, vol. 36.

\* cited by examiner

| PAGE 1 OF 1 | PATIENT NAME | | SEX | AGE | CLINICIAN |
|---|---|---|---|---|---|

| | | | CLIENT NAME AND ADDRESS | |
|---|---|---|---|---|
| PATIENT ID | BIRTH DATE | ACCESSION NUMBER | CLIENT NAME<br>ADDRESS 1<br>ADDRESS 2<br>CITY, STATE   ZIP<br>PHONE:   FAX: | CLIENT #/ROUTE # |

| DATE COLLECTED | DATE RECEIVED | REPORT DATE AND TIME | REQUISITION NUMBER | FASTING STATUS |
|---|---|---|---|---|

PARTICLE CONCENTRATION AND SIZE

LDL AND HDL PARTICLES — LOWER CVD RISK → HIGHER CVD RISK — PERCENTILE IN REFERENCE POPULATION (70)

| | | HIGH | 75th | 50th | 25th | LOW |
|---|---|---|---|---|---|---|
| HDL-P (TOTAL) | μmol/L 28.1 | | 35.1 | 30.6 | 26.8 △ | |

| | | LOW | 25th | 50th | 75th | HIGH |
|---|---|---|---|---|---|---|
| SMALL LDL-P | nmol/L 830 | | 110 | 506 | 808 △ | |

| | | LARGE (PATTERN A) | | SMALL (PATTERN B) | |
|---|---|---|---|---|---|
| LDL SIZE* | nm 20.4 | 23.0 | 20.6 | 20.5 △ | 19.0 |

*SMALL LDL-P AND LDL SIZE ARE ASSOCIATED WITH CVD RISK, BUT NOT AFTER LDL-P IS TAKEN INTO ACCOUNT.

LIPOPROTEIN MARKERS ASSOCIATED WITH INSULIN RESISTANCE (20)

INSULIN SENSITIVE ←(42)→ INSULIN RESISTANT — PERCENTILE IN REFERENCE POPULATION

| | | | LOW | 25th | 50th | 75th | HIGH |
|---|---|---|---|---|---|---|---|
| LARGE VLDL-P | 21 | nmol/L 8.2 | | 0.8 | 2.4 | 6.4 | △ 40 |
| SMALL LDL-P | 22 | nmol/L 830 | LOW | 110 | 506 | 808 △ 40 | HIGH |
| LARGE HDL-P | 23 | μmol/L 2.7 | HIGH 7.5 | 4.8 | 3.1 △ 40 | | LOW |
| VLDL SIZE | 24 | nm 50.4 | SMALL 42.1 | 46.3 △ 40 | 51.9 | | LARGE |
| LDL SIZE | 25 | nm 20.2 | LARGE 21.1 | 75th 20.8 | 50th △ 40 20.4 | | SMALL |
| HDL SIZE | 26 | nm 8.7 | LARGE 9.6 | 75th 9.2 | 50th 8.9 △ 40 | | SMALL |

} 10R

INSULIN RESISTANCE SCORE (50)

| | 0-100 | INSULIN SENSITIVE | 25th | 50th | 75th | INSULIN RESISTANT |
|---|---|---|---|---|---|---|
| LP-IR SCORE** | 84 | 0 | | | △ | 100 |

**THE LP-IR SCORE COMBINES THE INFORMATION FROM THE 6 LIPOPROTEIN MARKERS TO GIVE IMPROVED PREDICTION OF INSULIN RESISTANCE. (60)

FIG. 2B

©2009 LIPOSCIENCE, INC.

LIPOPROTEIN INSULIN RESISTANCE INDEXES AND RELATED METHODS, SYSTEMS AND COMPUTER PROGRAMS FOR GENERATING SAME

RELATED APPLICATIONS

This application claims the benefit of and priority to U.S. Provisional Application Ser. No. 61/106,833, filed Oct. 20, 2008, the contents of which are hereby incorporated by reference as if recited in full herein.

RESERVATION OF COPYRIGHT

A portion of the disclosure of this patent document contains material to which a claim of copyright protection is made. The copyright owner has no objection to the facsimile reproduction by anyone of the patent document or the patent disclosure, as it appears in the Patent and Trademark Office patent file or records, but reserves all rights whatsoever.

FIELD OF THE INVENTION

The present invention relates to systems and methods for assessing a patient's risk of developing Type 2 diabetes and/or assessing the patient's degree of insulin resistance.

BACKGROUND OF THE INVENTION

Type 2 diabetes mellitus (T2DM) is one of the most costly and burdensome chronic diseases, and is increasing in epidemic proportions in the U.S. and other countries. The defining feature of T2DM is hyperglycemia, a reflection of impaired carbohydrate (glucose) utilization resulting from a defective or deficient insulin secretory response. T2DM is currently defined in patients having a fasting plasma glucose level that is greater than or equal to 125 mg/dL. T2DM is a late manifestation of metabolic derangements that begin many years earlier. Its cause is believed to be a progressive increase in insulin resistance coupled with deteriorating β-cell function. So long as the pancreatic β-cells are able to secrete enough insulin to compensate for the progressive resistance of target tissues to insulin's hypoglycemic effects, the patient is able to maintain normal fasting glucose levels. Hyperglycemia and the transition to T2DM occur as a consequence of progressive β-cell dysfunction which leads to failure to maintain hypersecretion of insulin in the face of increasing insulin resistance. These potential metabolic changes over time and the impact on glucose levels are shown schematically in FIG. 1.

Type 2 diabetes has been traditionally diagnosed by the detection of elevated levels of glucose (sugar) in the blood (hyperglycemia). While hyperglycemia defines diabetes, it is a very late stage development in the chain of events that lead from insulin resistance to full-blown diabetes. Accordingly, it would be desirable to have a way of identifying whether or not a subject is at risk for developing Type 2 diabetes (i.e., is predisposed to the condition) prior to the development of the classic symptoms, such as hyperglycemia. Earlier detection of indicators of the disease (e.g., detection before glucose levels are elevated enough to be considered hyperglycemia) may lead to more effective treatment of the disease, if not actual prevention of the onset of the disease.

The most direct and accurate methods for assessing insulin resistance are laborious and time-consuming, and thus impractical for clinical application. The "gold standard" among these research methods is the hyperinsulinemic euglycemic clamp, which quantifies the maximal glucose disposal rate (GDR, inversely proportional to insulin resistance) during the clamp. Another arduous research method which is somewhat less reproducible (CV 14-30%) is the frequently sampled intravenous glucose tolerance test (IVGTT) with minimal model analysis, which measures insulin sensitivity ($S_i$), the inverse of insulin resistance.

U.S. Pat. No. 6,518,069 to Otvos et al. describes NMR derived measurements of glucose and/or certain lipoprotein values to assess a patient's risk of developing T2DM.

SUMMARY OF EMBODIMENTS OF THE INVENTION

The present invention relates to systems, methods and assessments for assessing a patient's level of insulin resistance and/or using same for determining whether subjects are at risk for having diabetes.

Embodiments of the invention provide methods that can predict a non-diabetic subject's level of insulin resistance. The methods include: (a) obtaining measurements of a plurality of selected lipoprotein parameters from an in vitro patient biosample; and (b) programmatically generating a lipoprotein insulin resistance index based on the obtained measurements.

The selected parameters can include at least four of the following: large VLDL, small LDL, and large HDL particle concentrations and VLDL, LDL, and HDL particle sizes (typically average sizes).

The generating step may include calculating a risk score for each of the plurality of obtained lipoprotein parameter measurements and summing the calculated risk scores to define the lipoprotein insulin index.

In some embodiments the patient's sample is a non-fasting blood plasma or serum sample and the obtained measurements include at least four NMR measurements, including NMR measurements of the small LDL and large HDL particle concentrations and the (average) LDL and HDL particle sizes. The generating step can include calculating a risk score for each of the at least four obtained measurements, and summing the four risk scores to generate the lipoprotein insulin resistance index.

In other embodiments, the patient's sample is a fasting sample and the obtained measurements include NMR measurements of all six of the lipoprotein parameters. The generating step can include calculating a risk score for each of the six obtained lipoprotein parameter measurements, and summing the six risk scores to generate the lipoprotein insulin resistance index.

In particular embodiments, the generating step may include calculating a risk score or selecting a risk score from a set of defined risk scores for each of the obtained lipoprotein parameter measurements, and summing the risk scores to generate the lipoprotein insulin resistance index with a value between 0-100, with 100 indicating a high degree of risk of insulin resistance. Larger values of the lipoprotein insulin resistance index can be correlated to an increased risk of developing diabetes.

Yet other embodiments are directed to patient test reports. The test reports include a lipoprotein insulin resistance index. The index is a composite number of risk scores correlated to each of a plurality of NMR-measured lipoprotein particle parameters of a patient blood or plasmas sample.

The plurality of parameters can include at least four of the following: large VLDL, small LDL, and large HDL particle concentrations and VLDL, LDL, and HDL particle sizes.

Still other embodiments are directed to computer programs for assessing decreased insulin sensitivity (e.g., insulin insensitivity) and/or insulin resistance in a non-diabetic subject. The computer program includes a computer readable storage medium having computer readable program code embodied in the medium. The computer-readable program code includes computer readable program code that determines NMR measurements of at least four of the following lipoprotein parameters: large VLDL, small LDL, and large HDL particle concentrations and VLDL, LDL, and HDL particle sizes; computer readable program code that associates a risk score for each of the at least four lipoprotein NMR measurements; and computer readable program code that uses the risk scores of each of the at least four NMR lipoprotein parameter measurements to generate a lipoprotein insulin resistance index.

Yet other embodiments are directed to systems for generating an insulin resistance index using measurement data of lipoprotein parameters in a blood or plasma sample of a subject. The systems include an NMR spectrometer for acquiring at least one NMR spectrum of an in vitro blood plasma or serum sample; and a processor in communication with the NMR spectrometer. The processor is configured to: (a) determine NMR measurements of a plurality of selected lipoprotein parameters; (b) calculate a risk score or select a risk score from a set of defined risk scores for each of the determined measurements of the selected lipoprotein parameters; and (c) sum the risk scores for each of the lipoprotein parameters to generate a lipoprotein insulin resistance index.

The selected lipoprotein parameters can include at least four of the following lipoprotein parameters in the blood plasma or serum sample: large VLDL, small LDL, and large HDL particle concentrations and VLDL, LDL, and HDL particle sizes Still other embodiments are directed to methods of evaluating the efficacy of treatment of a subject undergoing treatment to reduce insulin sensitivity. The methods include: (a) obtaining a first insulin resistance score using NMR measured lipoprotein parameters for a patient's blood plasma or serum sample, including at least a plurality of the following lipoprotein parameters: large VLDL, small LDL, and large HDL particle concentrations and VLDL, LDL, and HDL particle sizes; and programmatically generating a first insulin resistance score based on the values of the obtained measurements; then (b) obtaining a second insulin resistance analysis of a patient's blood plasma or serum sample obtained after the subject has initiated lifestyle or drug treatment for decreasing insulin sensitivity using NMR measured lipoprotein parameters for a patient's blood plasma or serum sample, including at least a plurality of the following lipoprotein parameters: large VLDL, small LDL, and large HDL particle concentrations and VLDL, LDL, and HDL particle sizes, and programmatically generating a second insulin resistance score based on the values of the obtained measurements; and (c) comparing the first and second scores to assess whether the risk number has decreased to provide an indication of the efficacy of treatment for the subject.

Embodiments of the invention provide for easy-to-understand insulin resistance assessments for identifying subjects with decreased insulin sensitivity (e.g., insulin insensitivity or resistance) and/or subjects that are at risk for developing or having diabetes earlier than has been conventionally achieved to enable more effective T2DM prevention by targeting at-risk patients for initiation of lifestyle interventions earlier than has been conventionally achieved for most people, such as when blood glucose levels are still in the normal range and β-cell function has not yet deteriorated.

Some embodiments of the invention are directed to insulin resistance tests that can assess insulin sensitivity/resistance and provide an insulin resistance index (e.g., score) associated with a (defined) scale to assess a patient's risk of developing Type 2 diabetes. The tests can be generated using an automated nuclear magnetic resonance (NMR) spectrometer to measure lipoprotein particle subclasses to quantify a plurality of the following: large VLDL, small LDL, and large HDL particle concentrations and (average) VLDL, LDL, and HDL particle sizes. Some tests can be done using fasting or non-fasting serum and plasma samples using nuclear magnetic resonance (NMR) spectroscopy. Some tests can also include measuring glucose using the same patient sample. The lipoprotein subclass (concentrations) and size measures are associated with insulin resistance and, in aggregate, can be used as a quantitative means to assess the level of insulin sensitivity of non-diabetic patients, for the purpose of aiding, in conjunction with other laboratory measurements and clinical evaluation, assessment of their risk of developing type 2 diabetes mellitus.

The tests can be based on measurements of a plurality of different lipoprotein subclasses measurements (e.g., typically between about four-six different lipoprotein factors) with each factor scored for risk individually. A composite or cumulative (aggregate) score can be used to define a lipoprotein insulin resistance index.

The foregoing and other objects and aspects of the invention are explained in further detail herein.

BRIEF DESCRIPTION OF THE DRAWINGS

FIG. 2B is another exemplary patient test report with a lipoprotein insulin resistance index according to embodiments of the present invention.

DETAILED DESCRIPTION OF EMBODIMENTS OF THE INVENTION

Figure 1:
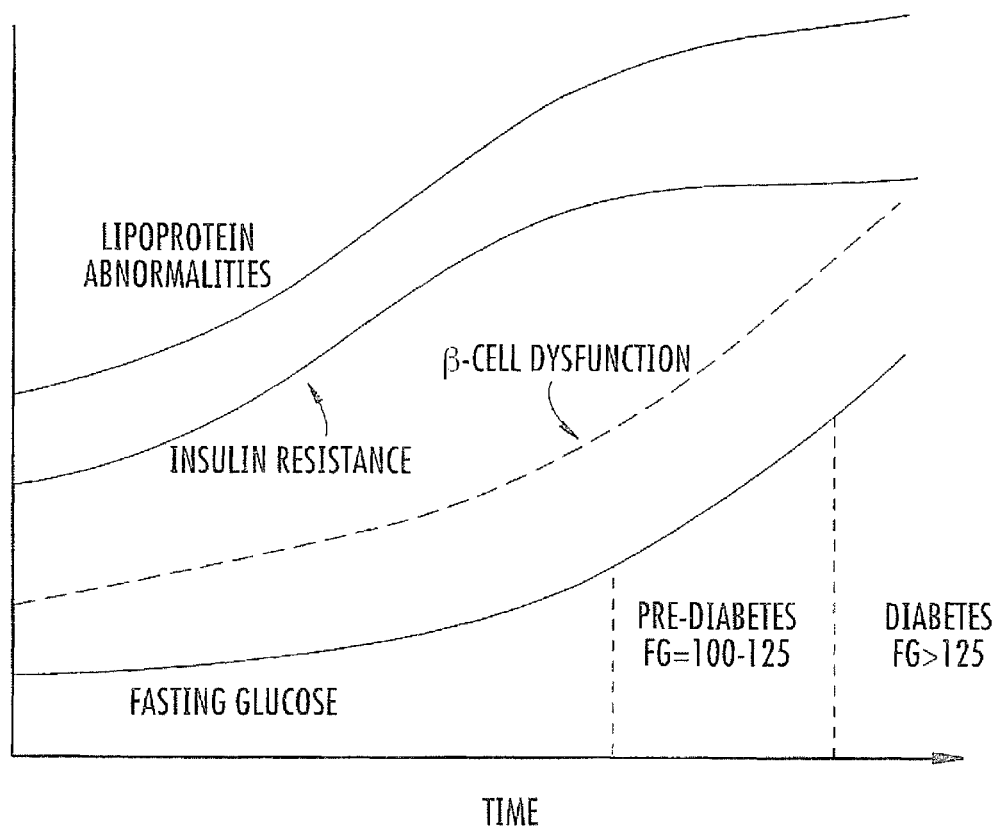
FIG. 1 is a graph that schematically illustrates metabolic changes over time.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "programmatically" means the instruction, calculation, function, feature, operation and/or step is carried out using computer program directions. The terms "automated" and "automatic" means that the operations can be carried out with minimal or no manual labor or input. The term "semi-automated" refers to allowing operators some input or activation, but the calculations, determinations and signal acquisition as well as the calculation of the concentrations and/or sizes of the lipoprotein parameters and/or insulin resistance markers are done electronically, typically programmatically, without requiring manual input.

The term "biosample" includes whole blood, plasma, serum, urine, cerebral spinal fluid (CSF), lymph samples, stool samples, tissues, and/or body fluids in raw form and/or in preparations. However, whole blood or plasma biosamples may be particularly suitable for embodiments of the present invention. The biosamples can be from any target subject. Subjects', according to the present invention, can be any animal subject, and are preferably mammalian subjects (e.g., humans, canines, felines, bovines, caprines, ovines, equines, rodents (mice, rats, hamsters, guinea pigs or others), porcines, primates, monkeys, and/or lagomorphs). The animals can be laboratory animals or non-laboratory animals, whether naturally occurring, genetically engineered or modified, and/or whether being laboratory altered, lifestyle and/or diet altered or drug treated animal variations.

The term "automatic" means that substantially all or all of the operations so described can be carried out without requiring active manual input of a human operator, and typically means that the operation(s) can be programmatically directed and/or carried out. The term "electronic" means that the system, operation or device can communicate using any suitable electronic media and typically employs programmatically controlling the communication between a control system that may be remote and one or more local NMR analyzers using a computer network.

The flowcharts and block diagrams of certain of the figures herein illustrate the architecture, functionality, and operation of possible implementations of analysis models and evaluation systems and/or programs according to the present invention. In this regard, each block in the flow charts or block diagrams represents a module, segment, operation, or portion of code, which comprises one or more executable instructions for implementing the specified logical function(s). It should also be noted that in some alternative implementations, the functions noted in the blocks might occur out of the order noted in the figures. For example, two blocks shown in succession may in fact be executed substantially concurrently or the blocks may sometimes be executed in the reverse order, depending upon the functionality involved.

As used herein, the term "Type 2 diabetes mellitus (T2DM)" also and interchangeably referred to as "non-insulin dependent diabetes mellitus (NIDDM)," refers to the disorder characterized by cellular resistance to insulin and/or secretion of less insulin than is necessary to keep blood glucose levels in balance. Type 1 diabetes, in contrast, refers to a disorder characterized by the destruction of insulin producing beta cells in the pancreas by an autoimmune reaction.

Before people develop "frank" T2DM, they pass through a transitional state of moderate hyperglycemia termed "pre-diabetes" by the American Diabetes Association, currently defined as impaired fasting glucose (IFG, fasting glucose between 100 and 125 mg/dL) or impaired glucose tolerance (IGT, glucose=140 to 199 mg/dL, 2 hours after a standard 75 g oral glucose load). Individuals with pre-diabetes have an increased risk of developing T2DM within a few years, and clinical trials have shown that lifestyle or pharmacologic interventions that increase insulin sensitivity can delay the onset of T2DM in these people.

However, it is increasingly being questioned whether intervention at the "pre-diabetes" stage is too late to prevent diabetes from occurring, as opposed to simply delaying its onset. The reason is that potentially significant (irreversible) $\beta$-cell dysfunction has typically occurred by the time a patient develops pre-diabetes (IFG or IGT). Earlier intervention with aggressive lifestyle modification when a patient becomes insulin resistant, or even before a patient becomes insulin resistant when elevated insulin sensitivity is detected, before there is $\beta$-cell damage, could prevent, not just delay, T2DM.

In the past, surrogate measures of insulin resistance suitable for use in a clinical setting all rely on laboratory tests performed on fasting blood samples. The oldest and most widely used method in epidemiologic studies is homeostasis model assessment (HOMA), based on fasting levels of insulin and glucose: HOMA=(fasting insulin×glucose)/22.5. A number of other estimates of insulin resistance based on a fasting plasma sample have been proposed. The performance of HOMA and these alternative insulin resistance estimates has been evaluated in studies of different patient populations by determining how they correlate with the gold standard euglycemic clamp measure. The log-transform of HOMA, log (HOMA), performed as well or better than any of the alternatives, giving strong correlations (r~0.8) with clamp-measured GDR.

Although HOMA is a useful index of insulin resistance in large population-based research studies, the ability of a single determination to evaluate insulin resistance in an individual patient is limited by its measurement variability. The coefficient of variation (CV) for HOMA can be as high as 30%, with CVs of 8 to 12% reported under more optimal conditions. Although biologic and analytic variability of fasting glucose makes some contribution to the variability of HOMA, limitations of the insulin measurement are more important. Commercial insulin assays differ in cross-reactivity between insulin and pro-insulin and it is believed that no standardization program has been instituted to help ensure inter-laboratory agreement of insulin values. Another limitation for measurement of fasting plasma insulin is the pulsatile mode of insulin secretion (pulses with a periodicity of 10-15 minutes). To minimize errors from this source of variation, it has been recommended that 3 blood samples be drawn 5 minutes apart.

Embodiments of the present invention are useful in assessing a single patient (e.g., blood/plasma) in vitro sample to provide a lipoprotein insulin resistance index that is correlated to levels of insulin sensitivity and/or insulin resistance. The lipoprotein insulin resistance index (e.g., score) can be used to assess the risk of the subject's having and/or developing diabetes. Insulin resistance means the failure of the body to respond normally to insulin. Insulin resistance is often a precursor to Type 2 diabetes. "Insulin resistance syndrome" or "Syndrome X" refers to a set of medical conditions related to insulin resistance in which high blood sugar levels stimulate the production of insulin. When a subject is unable to normally process excess insulin, insulin levels rise. Eventually, the subject has high blood sugar levels (hyperglycemia) and high insulin levels (hyperinsulemia). Under these conditions, insulin loses its ability to control fat metabolism, and excessive fats enter the bloodstream (hyperlipidemia). Hyperlipidemia contributes to high blood pressure, heart disease and stroke. Other disorders of insulin resistance include, but are not limited to, dyslipidemia, (including diabetic dyslipidemia) and full-blown Type 2 diabetes, juvenile diabetes and gestational diabetes.

One of the earliest manifestations of insulin resistance is an alteration of lipoprotein metabolism, producing triglyceride elevations and reductions in HDL cholesterol. See, Laasko et al., *Insulin resistance is associated with lipid and lipoprotein abnormalities in subjects with varying degrees of glucose tolerance*, Arteriosclerosis: 1990; 10-223-31. The metabolic changes accompanying insulin resistance produce even greater and more extensive abnormalities in lipoprotein subclass levels and particle size distributions which are detected by NMR LipoProfile® lipoprotein analysis. Specifically, large VLDL and small LDL subclass particle concentrations are higher and large HDL subclass levels are lower in insulin resistant individuals. NMR-measured VLDL, LDL, and HDL particle sizes also reflect insulin resistance status. VLDL size tends to be greater and LDL and HDL sizes smaller when a patient is insulin resistant.

Lipoproteins include a wide variety of particles found in plasma, serum, whole blood, and lymph, comprising various types and quantities of triglycerides, cholesterol, phospholipids, sphyngolipids, and proteins. These various particles permit the solubilization of otherwise hydrophobic lipid molecules in blood and serve a variety of functions related to lipolysis, lipogenesis, and lipid transport between the gut, liver, muscle tissue and adipose tissue. In blood and/or plasma, lipoproteins have been classified in many ways, generally based on physical properties such as density or electrophoretic mobility. Classification based on nuclear magnetic resonance-determined particle size distinguishes at least 15 distinct lipoprotein particle subtypes, including 5 subtypes of high density lipoproteins, 4 subtypes of low density lipoproteins, and 6 subtypes of very low density lipoproteins, designated TRL (triglyceride rich lipoprotein) V1 through V6.

As used herein, the term "small LDL particles" typically includes particles whose sizes range from between about 18 to less than 20.5 nm. The term "large LDL particles" includes particles ranging in diameter from between about 20.5-23 nm. It is noted that the LDL subclasses of particles can be divided in other size ranges. For example, the "small" size may be between about 19-20.5 nm, intermediate may be between about 20.5-21.2 nm, and large may be between about 21.2-23 nm. In addition, intermediate-density lipoprotein particles ("IDL" or "IDL-P"), which range in diameter from between about 23-29 nm, can be included among the particles defined as "large" LDL.

The term "large HDL particles" ("large HDL-P") typically includes HDL subclasses of particles whose sizes range from between about 9.4 to about 14 nm. The term "small HDL particles" (small HDL-P) typically includes particles ranging in diameter between about 7.3 to about 8.2 nm. The intermediate or medium HDL particles (medium HDL-P) can be parsed into one of the small or large designations or be measured separately as including particles in the size range that is typically between about 8.2 to 9.4 nm. Thus, either or both the ranges of size above can be broadened to include some or all the sizes of the intermediate HDL particles.

The term "large VLDL particles" refers to particles at or above about 55 nm.

The particle sizes noted above typically refer to average measurements, but other demarcations may be used.

The terms "population norm" and "standard" refer to values of lipoprotein parameters in populations of study participants that were evaluated for insulin resistance using a different measure of insulin resistance, e.g., a gold standard euglycemic clamp method, glucose tolerance tests, and HOMA as will be discussed further below. However, embodiments of the instant invention are not limited to these population values as the presently defined normal and at-risk population values for one or more of the lipoprotein parameters may change.

Generally stated, embodiments of the invention measure lipoprotein subclass concentrations and size and use a plurality of those measurements as separate and/or independent predictors of insulin resistance that can then be combined to form a lipoprotein (composite) insulin resistance index (e.g., score) to provide a more reliable indicator of insulin resistance level in the subject and/or a predictor of risk of diabetes or other (insulin resistance related abnormalities) based on that level. Just as hemoglobin $A_1c$ provides a more accurate, time-integrated indication of a patient's glycemic status compared to a single fasting glucose measurement, while not wishing to be bound to any one theory, it is postulated that lipoprotein subclass concentrations and particle sizes can provide an accurate and stable reflection of a patient's insulin resistance status. This postulate is based (at least in part) on evidence that hepatic insulin resistance manifests its earliest measurable abnormalities in changes in lipoprotein metabolism, producing elevations in triglycerides and reductions in HDL cholesterol. The metabolic changes induced by or accompanying decreased insulin sensitivity and/or insulin resistance produce more extensive abnormalities in lipoprotein subclass levels and particle size distributions which are detectable by NMR.

It is also noted that while NMR measurements of the lipoprotein particles are contemplated as being particularly suitable for the analyses described herein, it is contemplated that other technologies may be used to measure these parameters now or in the future and embodiments of the invention are not limited to this measurement methodology. For example, flotation and ultracentrifugation employ a density-based separation technique for evaluating lipoprotein particles.

As depicted in FIG. 1, the development and progression of these lipoprotein subclass abnormalities occurs early and in parallel with the development and progression of insulin resistance, with the onset of both taking place years before the emergence of abnormal glucose tolerance. Evidence, such as that discussed below, shows that the lipoprotein subclass and size information measured by NMR or other suitable means, taken together in the form of a (composite) lipoprotein insulin resistance index, can provide a clinically useful means of assessing a patient's insulin resistance status.

Lipoprotein subclass/size variable can be combined by taking into account their differential strengths of association with insulin resistance to produce a lipoprotein insulin resistance index (e.g., score). A person's insulin resistance can extend over a continuum from low to high and the lipoprotein insulin resistance "index" is a guide or predictor of a person's insulin resistance status. The term "index" refers to a number, letter and/or symbol that can characterize a subject's insulin resistance level in a range of from low (e.g., insulin sensitive) to high (a greater degree of insulin resistance).

While it is contemplated that the index will be particularly useful when provided as a numerical score, other indexes can be used. The term "score" refers to a result expressed numerically, typically on a defined scale or within a defined range of values. In particular embodiments, the lipoprotein insulin resistance index can be provided as or include a score within a defined range, such as, for example, between 0-10, 0-24, 0-100, or 0-1000 and the like (with the lowest number being associated with most insulin sensitivity or associated with a low insulin resistance and the highest number in the range being associated with the most insulin resistance or a higher degree of insulin resistance). The lower value in the range may be above "0" such as 1, 2, 3, 4 or 5 and the like, or may even be a negative number (e.g., −1, −2, −3, 4, −5 and the like). Other index examples, include, for example, alphanumeric indexes such as "100A", "100B", terms such as "IR positive", "IR high", "IR neutral", "IR low", "IR good", "IR bad", "IR watch" and the like.

Figure 2A:
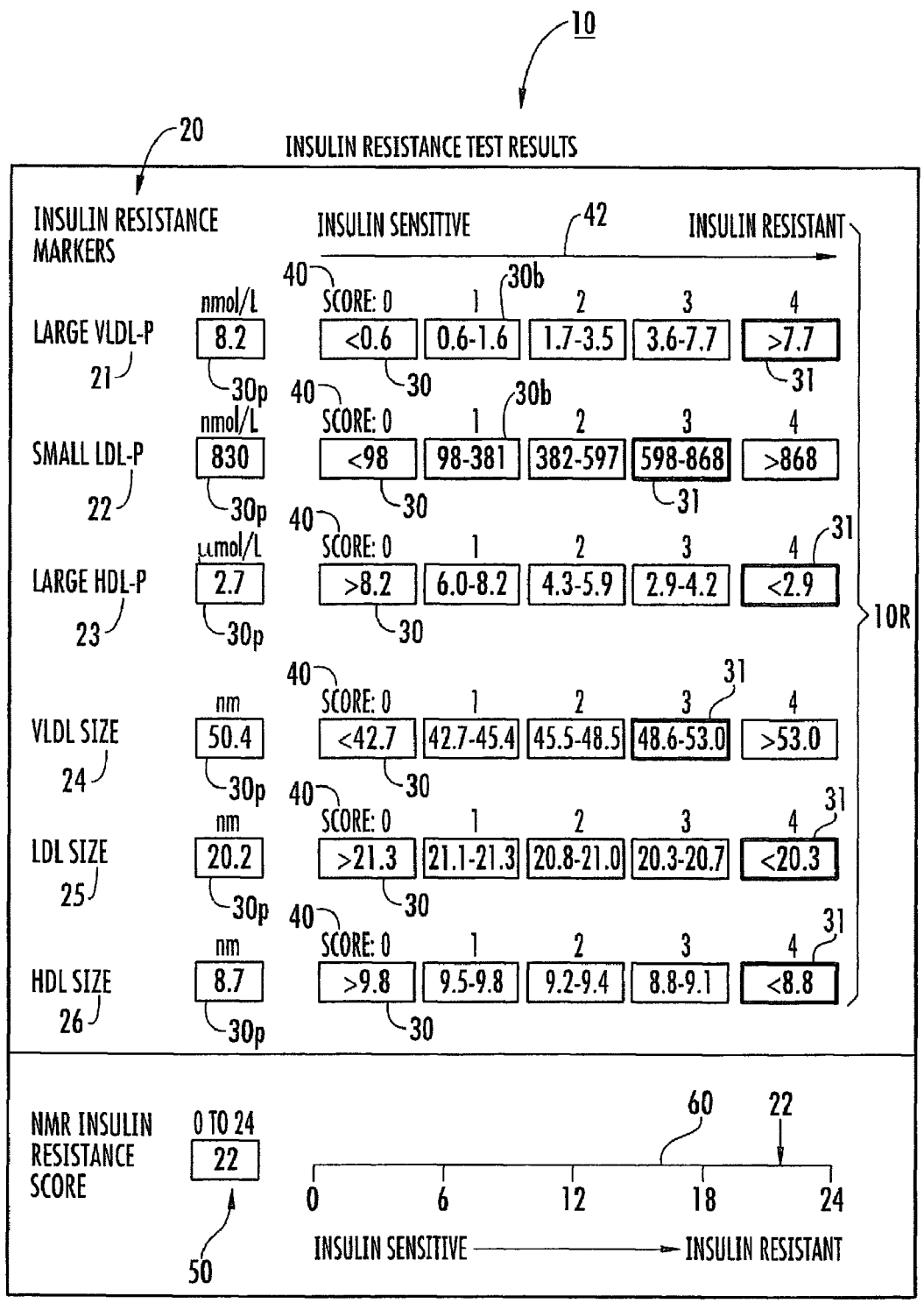
FIG. 2A is an exemplary patient test report with a lipoprotein insulin resistance index according to embodiments of the present invention.

FIGS. 2A and 2B illustrates exemplary patient test reports 10 with the insulin resistance index 50 and lipoprotein particle measurements as insulin resistance markers 20 that can each be treated as independent risk factors (each has an independent association with insulin resistance). With this information, patients can be alerted to a heightened risk of developing type 2 diabetes, before becoming overtly "prediabetic", potentially in time for effective lifestyle modification to prevent, not just delay, the onset of that disease. The report 10 can be electronically provided to a clinician or patient and/or provided as a "paper" report.

The report 10 can provide the index 50 as a "bare bones" index (e.g., score) alone or with a lipoprotein-based test/screen for cardiovascular disease or "CVD" 70. Cardiovascular disease (CVD) is a general term used to describe disorders that can affect your heart (cardio) and/or your body's system of blood vessels (vascular). The same biosample can be used to generate both the CVD analysis 70 and the index 50.

As shown, the test report 10 can show the insulin resistance markers 20 which are used to calculate or determine the index 50. (However, these parameters may be omitted from the report as noted above). The markers 20 can include a plurality of the following (shown as all of the following six lipoprotein particle parameters), concentrations of large VLDL-P 21, small LDL-P 22, large HDL-P 23, and VLDL size 24, LDL size 25, and HDL size 26. The VLDL size 24, LDL size 25, and HDL size 26. As noted above, the size parameters may be measured as "average" particle size, however, other size demarcations may be used.

A set of possible respective risk scores 30 can be defined based on the differential strengths of association for each of the lipoprotein parameters used as insulin resistance markers 20 which can be used to determine the index 50. That is, a risk score for a lipoprotein measurement value or range of values can be defined for each lipoprotein particle parameter. The risk scores 30 for different values of the different parameters 21-26 are pre-defined, one for a value or range of values of lipoprotein measurements 30p. The actual measurement 30p is correlated to one of the defined risk scores 30 for that parameter 20 and this number provides the risk score 40 for that lipoprotein particle parameter measurement 30p for that patient.

FIG. 2A shows that the risk scores vary from 0-4 and that the patient risk score 40 for marker 21 is "4" and a total largest possible index number of 24. FIG. 2B uses different ranges of risk scores 30 from, for example 0-26, 0-27 or 0-32 for one parameter and 0-8, 0-4 and 0-6 for another (depending on the type of sample and the calculation model used) with different value ranges and scoring numbers for each parameter and with each lipoprotein parameter 20 having a different possible high end risk score number with a total largest possible index number of 100. The largest possible risk score 30 for a measurement 30p of the lipoprotein parameters 20 in FIG. 2B is for VLDL particle size 24. Large VLDL particle concentration 21 has the second largest possible risk score number 30. FIG. 2B illustrates that the risk score 40 for large VLDL-P concentration 21 is greater than the score 40 for VLDL particle size 24 for this patient. The different risk scores 30 are not shown on the report 10 in FIG. 2B.

It is contemplated that, to determine the index 50, an equation can be used to combine the different scores 40. To generate or provide the score 40 for an actual measurement 30p for a parameter 20, the associated risk score 30 can be selected from a set of predefined risk scores for a respective lipoprotein parameter or the risk score can be calculated using an equation that correlates a risk score to the actual measurement.

As shown in FIGS. 2A and 2B, the report 10 can provide a "transparent" risk model 10R for the risk markers 20 (21-26). FIGS. 2A and 2B also illustrate that the lipoprotein insulin resistance index 50 may be provided with a scale 60 that represents a possible continuum of results from insulin sensitivity/low insulin resistance to high insulin resistant to illustrate the range of possible results.

Methods and systems of embodiments of the invention contemplate that the index 50 may be calculated differently for different samples depending on whether the specimen/sample for the lipoprotein measurements was a fasting or non-fasting sample/specimen and/or if the patient is on lipid-altering medication. The index 50 and/or scoring of the markers 20 may also be gender-specific (the risk score may be different for the same lipoprotein particle measurement for a female versus a male). Alternatively, the report 10 and or index 50 may be calculated the same irrespective of whether the patient was on lipid altering medications or whether the specimen was a fasting or non-fasting type. For example, if the former, if a patient is on statins, the index 50 may be calculated by eliminating the small LDL particle concentration as one of the risk markers 20 and the total possible index or range can be reduced accordingly. Alternatively, in some particular embodiments, it is contemplated that as the small LDL particle concentration is only 1 of 6 potential markers 20, the index 50 can be calculated in the same manner irrespective of whether a patient is on statins, as the overall index may not be materially affected.

Each marker 20 can have a separately calculated risk score 40 depending on the patient's measurement of that marker 20. The pre-defined risk scores 30 that are used to define the respective patient score 40 can be defined based on whether a measured lipoprotein particle value is in a lower or higher segment (typically defined by different quintiles) of population norms, lower risks have lower scores. Each marker 20 can have a risk range that is the same, e.g., 0-4, 0-10, 0-25 and the like or each marker 20 or some markers 20 can have a risk range that is different from others. For example, a non-linear equation can be used to generate the index 50. The ranges of risk scores 30 can be different and at least one of the lipoprotein particle parameters 20 can have a higher possible risk score 30 than others. See, e.g., Tables 1-3 below.

In FIG. 2A, the possible risk scores for each marker 20 are from 0-4, for a total highest possible number of 24. The score values 30 of each risk marker 20 increase, typically in successive integer values. However, the score values 30 can be non-successive and are not required to be integers.

The score values 30 can increase for a particular measurement value or a range of values 30p which in the embodiment shown in FIG. 2A may be provided in segments of different successive quintile ranges of values 30 for each of the different markers 20 associated with different lipoprotein parameter values 21-26 in a direction associated with increased insulin resistance risk (per the arrow 42) from a high insulin sensitivity (or low insulin resistance) at a defined range of values 30 with a risk score of "0" to a greater score 30 associated with a greater degree of insulin resistance associated with a marker value in a different quintile range.

Alternatively, one or more markers 20 may have a different risk scale with higher scores assigned to its measurement ranges than to those of other markers, and the scores need not be incremental or successive integers (e.g., the scores can be, for example, 0, 1, 3, 5 and 7 (or more), for the respective different quintiles for the VLDL-P concentration measurement). In addition, the lowest number may be negative or above "0".

While certain of these lipoprotein parameters 21-26 have stronger independent correlations (independent risk contributors) with insulin resistance than others, the index 50 can be calculated to include both those of higher and lower contributors (e.g., some of the information provided by some of the parameters may be redundant with the information provided by another of the parameters). For example, using four or more of the different lipoprotein parameters 20 to generate the index 50 (e.g., a composite index that considers several different lipoprotein particle measurements each of which can be associated with insulin resistance) can help the index 50 be a more reliable or stable indicator (e.g., similar to a time average measurement) as the test is typically taken at a single point in time with a single sample. That is, at any one point in time for a particular patient, any single factor can be subject to patient and/or analytic variation. Using a plurality of the lipoprotein risk markers, typically at least four, and in some embodiments, the six shown in FIGS. 2A and 2B, can provide a better and/or more stable index 50.

FIGS. 2A and 2B illustrate an exemplary simple and easy-to-understand report 10 that includes the predictive information supplied by the NMR insulin resistance markers 20. Patient results 30p for each of the six markers 21-26 are shown or displayed. FIG. 2A shows a report 10 with a patient measurement 30p and adjacent and aligned therewith are boxes 30b showing the ranges of data in segments associated with different risk scores 30, shown here as corresponding to quintiles of a reference population of non-diabetic individuals (in this example, using MESA as the source of this normal range data). As shown, the quintile boxes 30b are arrayed from left to right according to their relationships with insulin resistance, with those denoting the highest insulin resistance to the far right. A marker score 30 (e.g., from 0 to 4) is assigned to each box (e.g., population sub-group), higher numbers corresponding to values associated with greater insulin resistance. The appropriate boxes corresponding to the patient's measured results for each of the six parameters can be visually enhanced 31 (such as highlighted, shown in bold, red or in another visually enhanced manner). The patient measurement results in a score 40 for each of these six boxes 31 that may be summed to give the lipoprotein insulin resistance index 50. As shown in FIG. 2A, the index 50 is a number in this example that is between 0 to 24 (4+3+4+3+4+4=22 in the example in FIG. 2A). This index score 50 can be displayed at the bottom of the report 10 and/or in other locations, such as at the top. As shown, the report 10 can also show the relative degree of risk with a visual arrow/scale or ruler 60 depicting that higher scores indicate an increasingly greater likelihood that the patient has a higher degree of insulin resistance.

FIG. 2B illustrates that each measurement 30p can be shown adjacent to a scale of low to high, high to low, small to large and small to large, all arranged to show increasing risk in the same direction. The actual risk score 40 can be indicated by a visual marker. As shown, a triangle indicate the percentile value of the measured subclass/size 30p of variable 20, to provide an indication of where along the continuum of low to high values the patient's value is situated. The possible scores 30 are not identified on this report.

In some embodiments, the index 50 can provide a predictor of a patient's insulin resistance status as a continuum, with an index 50 that is closer to the maximum representing a higher degree of insulin resistance and a higher risk of developing diabetes, rather than making a categorical diagnosis of the presence or absence of insulin resistance. This type of index 50 of metabolic abnormality may help a clinician convince a patient to exercise, change a diet and/or lose weight to influence (and reduce and/or favorably alter) this index 50—preventing the onset of pre-diabetes and ultimately, diabetes.

However, it is possible that a patient having an index 50 in the top quartile, e.g., above 18 or between 18-24 in the score range shown in FIG. 2A or at or above the 75th percentile level in FIG. 2B, may be diagnosed with pre-diabetes and/or recommended for further medical evaluation to assess glucose abnormalities to confirm this condition.

Again, the exemplary reports 10 illustrate an easy to understand format with a relatively "transparent" summary of risk by relevant marker 20, but other embodiments of the invention envision generating and providing the insulin resistance index 50 in "opaque" form, e.g., as a single number without the details of the independent lipoprotein parameter values and associated risk values defined for these markers. If this format is used, the scale 60 may optionally also be provided.

Tables 1-3 show exemplary equations and risk scores 30 that can be associated with different measurements of the lipoprotein parameters 20. The risk score data can be used to generate an index 50 in a range of between 0-100, such as that shown with respect to the index 50 shown in the report of FIG. 2B.

Tables 1-3 are tables that show the six lipoprotein parameters 21-26 (FIGS. 2A, 2B) noted above with risk scores 30 (identified with the word "score" in the tables) correlated to measurement values or ranges of values of the lipoprotein parameters in adjacent columns. Table 1 shows exemplary scores 30 used to calculate the index 50 for females while Table 2 shows the same information for males. Thus, Table 1 and 2 illustrate examples of gender specific indices 50. As shown, the parameter risk scores 30 are parameter-specific and, for particular lipoprotein measurements of a respective parameter 21-26, can be different for the same value/range of values for females and males. Table 3 illustrates a gender neutral index 50 and risk scores 30 for the lipoprotein parameters 20.

TABLE 1

Female Lipoprotein Insulin Resistance Index Calculation Data
Female LP-IR Index: LP-IR (F) = vszsc + lszsc + hszsc + vlpsc + lspsc + hlpsc (Equation 1)

| VLDL Size (nm) | vszsc score | LDL Size (nm) | lszsc score | HDL Size (nm) | hszsc Score | Large VLDL-P (nmol/L) | vlpsc score | Small LDL-P (nmol/L) | lspsc score | Large HDL-P (μmol/L) | hlpsc score |
|---|---|---|---|---|---|---|---|---|---|---|---|
| <39.2 | 0 | <20.6 | 8 | <8.8 | 19 | <0.4 | 0 | <90 | 0 | <3.1 | 14 |
| 39.2-41.1 | 1 | 20.6-20.9 | 7 | 8.8-8.9 | 17 | 0.4-0.6 | 1 | 90-104 | 1 | 3.1-4.0 | 13 |
| 41.2-42.7 | 2 | 21.0-21.1 | 6 | 9.0 | 12 | 0.7-1.1 | 3 | 105-128 | 3 | 4.1-4.7 | 12 |
| 42.8-44.3 | 3 | 21.2 | 3 | 9.1-9.2 | 10 | 1.2-1.3 | 5 | 129-372 | 4 | 4.8-5.4 | 11 |
| 44.4-46.0 | 4 | 21.3-21.4 | 1 | 9.3 | 8 | 1.4-1.5 | 7 | 373-484 | 6 | 5.5-6.3 | 9 |
| 46.1-48.1 | 5 | >21.4 | 0 | 9.4 | 6 | 1.6-1.7 | 10 | 485-600 | 7 | 6.4-7.1 | 7 |
| 48.2-49.1 | 6 | ldldif < 150** | 4 | 9.5 | 4 | 1.8-2.5 | 13 | >600 | 8 | 7.2-8.0 | 4 |
| 49.2-50.3 | 7 | | | 9.6-9.7 | 2 | 2.6-3.1 | 15 | | | 8.1-9.3 | 2 |
| 50.4-51.6 | 8 | | | >9.7 | 0 | 3.2-3.7 | 17 | | | >9.3 | 0 |
| 51.7-53.2 | 9 | | | hdlp < 5*** | 8 | 3.8-5.1 | 19 | | | | |
| 53.3-55.3 | 10 | | | | | 5.2-7.3 | 21 | | | | |
| 55.4-58.4 | 13 | | | | | 7.4-11.7 | 22 | | | | |
| 58.5-60.0 | 16 | | | | | >11.7 | 24 | | | | |
| 60.1-63.0 | 20 | | | | | | | | | | |
| >63.0 | 27 | | | | | | | | | | |
| vtg < 30* | 0 | | | | | | | | | | |

*vtg = VLDL triglyceride (mg/dL);
**ldldif = LDL minus IDL particle number (nmol/L);
***hdlp = HDL particle number (nmol/L)

TABLE 2

Male Lipoprotein Insulin Resistance Index Calculation Data
Male LP-IR Index: LP-IR (M) = vszsc + lszsc + hszsc + vlpsc + lspsc + hlpsc (Equation 2)

| VLDL Size (nm) | vszsc score | LDL Size (nm) | lszsc score | HDL Size (nm) | hszsc Score | Large VLDL-P (nmol/L) | vlpsc score | Small LDL-P (nmol/L) | lspsc score | Large HDL-P (μmol/L) | hlpsc score |
|---|---|---|---|---|---|---|---|---|---|---|---|
| <39.2 | 0 | <20.8 | 4 | <8.5 | 17 | <0.7 | 0 | <94 | 0 | <1.9 | 10 |
| 39.2-41.1 | 3 | 20.8-20.9 | 3 | 8.5-8.6 | 15 | 0.7-0.9 | 3 | 94-332 | 1 | 1.9-2.3 | 9 |
| 41.2-42.7 | 5 | 21.0 | 2 | 8.7 | 13 | 1.0-1.1 | 6 | 333-472 | 2 | 2.4-2.7 | 8 |
| 42.8-44.3 | 8 | >21.0 | 0 | 8.8 | 10 | 1.2-1.7 | 9 | 473-568 | 3 | 2.8-3.1 | 7 |
| 44.4-46.0 | 10 | ldldif < 150** | 2 | 8.9 | 8 | 1.8-2.6 | 12 | 569-672 | 4 | 3.2-3.5 | 6 |
| 46.1-48.1 | 12 | | | 9.0 | 6 | 2.7-4.1 | 15 | 673-767 | 5 | 3.6-4.1 | 4 |
| 48.2-49.1 | 15 | | | 9.1 | 4 | 4.2-6.1 | 18 | 768-869 | 6 | 4.2-4.9 | 3 |
| 49.2-50.3 | 18 | | | 9.2 | 1 | 6.2-9.1 | 21 | 870-991 | 7 | 5.0-5.9 | 1 |
| 50.4-51.6 | 21 | | | >9.2 | 0 | 9.2-14.1 | 23 | 992-1166 | 8 | >5.9 | 0 |
| 51.7-53.2 | 24 | | | hdlp < 5*** | 6 | >14.1 | 24 | >1166 | 9 | | |
| 53.3-55.3 | 27 | | | | | | | | | | |
| 55.4-58.4 | 30 | | | | | | | | | | |
| 58.5-63.0 | 33 | | | | | | | | | | |
| >63.0 | 36 | | | | | | | | | | |
| vtg < 30* | 0 | | | | | | | | | | |

*vtg = VLDL triglyceride (mg/dL);
**ldldif = LDL minus IDL particle number (nmol/L);
***hdlp = HDL particle number (nmol/L)

TABLE 3

Non-Gender Specific Lipoprotein Insulin Resistance Index Calculation Data
Non-Gender-Specific LP-IR Index: LP-IR = vszsc + lszsc + hszsc + vlpsc + lspsc + hlpsc (Equation 3)

| VLDL Size (nm) | vszsc score | LDL Size (nm) | lszsc score | HDL Size (nm) | hszsc score | Large VLDL-P (nmol/L) | vlpsc score | Small LDL-P (nmol/L) | lspsc score | Large HDL-P (μmol/L) | hlpsc score |
|---|---|---|---|---|---|---|---|---|---|---|---|
| <39.2 | 0 | <21.0 | 6 | <8.7 | 20 | <0.7 | 0 | <90 | 0 | <3.1 | 12 |
| 39.2-41.1 | 1 | 21.0 | 5 | 8.7 | 16 | 0.7-1.0 | 2 | 90-104 | 1 | 3.1-4.0 | 10 |
| 41.2-42.8 | 2 | 21.1 | 3 | 8.8 | 12 | 1.1-1.3 | 5 | 105-128 | 3 | 4.1-5.4 | 9 |
| 42.8-44.3 | 4 | 21.2 | 2 | 8.9 | 10 | 1.4-1.5 | 7 | 129-372 | 4 | 5.5-6.3 | 8 |
| 44.4-46.0 | 6 | >21.2 | 0 | 9.0 | 9 | 1.6-1.7 | 9 | 373-961 | 6 | 6.4-7.1 | 6 |
| 46.1-48.1 | 9 | ldldif < 150** | 3 | 9.1-9.2 | 7 | 1.8-2.5 | 12 | >961 | 8 | 7.2-8.0 | 4 |
| 48.2-50.3 | 10 | | | 9.3 | 5 | 2.6-3.7 | 15 | | | 8.1-9.3 | 2 |
| 50.4-51.6 | 11 | | | 9.4-9.5 | 4 | 3.8-5.3 | 18 | | | >9.3 | 0 |
| 51.7-53.2 | 12 | | | 9.6-9.7 | 2 | 5.4-7.9 | 19 | | | | |
| 53.3-55.3 | 15 | | | >9.7 | 0 | >7.9 | 22 | | | | |
| 55.4-58.4 | 18 | | | hdlp < 5*** | 8 | | | | | | |
| 58.5-61.0 | 19 | | | | | | | | | | |
| 61.1-63.0 | 22 | | | | | | | | | | |
| 63.1-64.1 | 25 | | | | | | | | | | |
| 64.2-65.1 | 28 | | | | | | | | | | |
| >65.1 | 32 | | | | | | | | | | |
| vtg < 30* | 0 | | | | | | | | | | |

*vtg = VLDL triglyceride (mg/dL);
**ldldif = LDL minus IDL particle number (nmol/L);
***hdlp = HDL particle number (nmol/L)

Thus, while Equations 1-3 are the same, the scores 30 available for the subjects are different based on gender specific risk score (or a unisex risk score) potentially resulting in a somewhat different value for the index 50 using the same measurements for a particular patient.

Strong associations between insulin resistance and the six lipoprotein particle concentration and size parameters 20 measured by the NMR LipoProfile® lipoprotein test, available by LipoScience, Inc., having a principal place of business in Raleigh, N.C., have been documented in two published studies and a large unpublished study, each using a different measure of insulin resistance. These associations are summarized in Table 4. The first published study was conducted at the Medical University of South Carolina (MUSC) on a relatively small number of subjects (n=148: 46 with untreated diabetes; mean age 37 y; 43% male; 66% Caucasian) (Garvey W T et al. *Effects of Insulin Resistance and Type 2 Diabetes on Lipoprotein Subclass Particle Size and Concentration Determined by Nuclear Magnetic Resonance. Diabetes* 2003; 52:453-62.). Insulin resistance was measured using the gold standard euglycemic clamp method, and the NMR LipoProfile® lipoprotein tests were conducted on frozen fasting serum specimens.

The second published study was the Insulin Resistance Atherosclerosis Study (IRAS) (Goff D C Jr et al. *Insulin resistance and adiposity influence lipoprotein size and subclass concentrations. Results from the Insulin Resistance Atherosclerosis Study. Metabolism* 2005; 54:264-70). NMR LipoProfile® lipoprotein analyses were conducted on frozen plasma samples from 1,371 participants with a mean age of 55.5 years. The study population was 55% women and approximately one-third each were African. Americans, Hispanic Americans, and non-Hispanic whites. 46% were normoglucose tolerant, 22% had impaired glucose tolerance, and 32% had diabetes. Insulin resistance was measured by the frequently sampled intravenous glucose tolerance test.

The third (unpublished) study is the Multi-Ethnic Study of Atherosclerosis (MESA). MESA is a large, NHLBI-sponsored observational study of 6,814 white, black, Hispanic, and Chinese men and women aged 45-84 years with no evidence of clinical cardiovascular disease. Fasting blood samples were collected at the baseline exam (2000-2002) from all participants. Serum glucose was measured by the Vitros analyzer (Johnson & Johnson Clinical Diagnostics) and insulin was determined by radioimmunoassay using the Linco Human Insulin Specific RIA kit (Linco Research). HOMA (homeostasis model assessment of insulin resistance index) was calculated as insulin (mU/l)×(glucose [mg/dl]× 0.055)/22.5 and values were natural log-transformed for analysis. NMR LipoProfile® lipoprotein test measurements were conducted at LipoScience on frozen baseline plasma specimens. Development of both gender-specific and non-gender-specific lipoprotein insulin resistance score algorithms was guided in part by data from the subset of MESA participants without diabetes who provided informed consent and were not taking any lipid-altering medications (n=4,085).

TABLE 4

Correlations of NMR-Measured Lipoprotein Subclasses and Particle Sizes with Different Measures of Insulin Resistance in 3 Studies*

| Subclass/Size Parameter | GDR in MUSC[1] (n = 148) | $S_i$ in IRAS[2] (n = 1371) | HOMA in MESA[3] (n = 4085) |
|---|---|---|---|
| Large VLDL-P | −0.35 | −0.32 | 0.45 |
| Small LDL-P | −0.36 | −0.34 | 0.37 |
| Large HDL-P | 0.29 | 0.31 | −0.39 |
| VLDL Size | −0.40 | −0.38 | 0.38 |
| LDL Size | 0.30 | 0.34 | −0.35 |
| HDL Size | 0.30 | 0.33 | −0.36 |

*Values are Spearman correlation coefficients for the lipoprotein subclass/size associations with the measures of insulin resistance used in the 3 studies.
[1]Correlations (all p < 0.001) with glucose disposal rate (GDR) measured by the euglycemic clamp method, adjusted for age, gender, race, and BMI (Garvey et al. Diabetes 2003; 52: 453-62). GDR is inversely proportional to insulin resistance. The study population included 46 individuals with untreated diabetes.
[2]Correlations (all p < 0.001) with insulin sensitivity ($S_i$) measured by the frequently sampled intravenous glucose tolerance test, adjusted for age, gender, and ethnicity (Goff et al. Metabolism 2005; 54: 264-70). $S_i$ is inversely proportional to insulin resistance. The study population included 437 individuals with type 2 diabetes.
[3]Correlations (all p < 0.001) with the HOMA estimate of insulin resistance determined from fasting insulin and glucose concentrations. The study population was restricted to non-diabetic subjects not treated with lipid-altering drugs.

Table 5 shows the gender-specific percentile distributions of HOMA values in the MESA non-diabetic population. Also shown are the natural log-transformed values of HOMA, ln(HOMA), which are more closely and linearly related to the gold standard euglycemic clamp measure of insulin resistance. In Table 6 are the percentile distributions of the six NMR subclass and particle size markers of insulin resistance in men and women separately and combined.

TABLE 5

Distributions of HOMA and ln(HOMA) Values in MESA (n = 4085)*

| | Percentile | | | | |
|---|---|---|---|---|---|
| | 10th | 25th | 50th | 75th | 90th |
| HOMA | | | | | |
| All | 0.5 | 0.8 | 1.2 | 1.9 | 2.9 |
| Men | 0.5 | 0.8 | 1.3 | 2.0 | 3.0 |
| Women | 0.5 | 0.7 | 1.1 | 1.8 | 2.7 |
| ln(HOMA) | | | | | |
| All | −0.7 | −0.3 | 0.2 | 0.6 | 1.0 |
| Men | −0.6 | −0.3 | 0.2 | 0.7 | 1.1 |
| Women | −0.7 | −0.3 | 0.1 | 0.6 | 1.0 |

*Excluding subjects with diabetes and those on lipid-altering drugs.

TABLE 6

Distribution of Lipoprotein Subclass and Particle Size Parameters in the MESA Reference Population (n = 4085: 1955 men; 2130 women)

| | Small LDL-P (nmol/L) | | | Large HDL-P (µmol/L) | | | Large VLDL-P (nmol/L) | | |
|---|---|---|---|---|---|---|---|---|---|
| Percentile | All | Men | Women | All | Men | Women | All | Men | Women |
| 5 | 68 | 77 | 63 | 1.9 | 1.6 | 2.7 | 0.2 | 0.2 | 0.2 |
| 10 | 79 | 93 | 74 | 2.3 | 1.9 | 3.3 | 0.3 | 0.3 | 0.3 |
| 25 | 112 | 410 | 94 | 3.2 | 2.6 | 4.5 | 0.8 | 0.8 | 0.8 |
| 50 | 507 | 655 | 339 | 4.9 | 3.6 | 6.5 | 2.4 | 2.5 | 2.4 |
| 75 | 812 | 910 | 638 | 7.5 | 5.3 | 8.9 | 6.5 | 7.2 | 6.0 |
| 90 | 1069 | 1148 | 948 | 10.2 | 7.7 | 11.6 | 12.5 | 13.9 | 11.6 |
| 95 | 1230 | 1294 | 1114 | 12.0 | 9.4 | 13.3 | 17.2 | 18.8 | 15.6 |

| | LDL Size (nm) | | | HDL Size (nm) | | | VLDL Size (nm) | | |
|---|---|---|---|---|---|---|---|---|---|
| Percentile | All | Men | Women | All | Men | Women | All | Men | Women |
| 5 | 19.9 | 19.7 | 20.1 | 8.6 | 8.6 | 8.7 | 37.9 | 37.7 | 38.1 |
| 10 | 20.0 | 19.9 | 20.3 | 8.7 | 8.6 | 8.9 | 39.2 | 39.2 | 39.3 |
| 25 | 20.4 | 20.2 | 20.7 | 8.9 | 8.8 | 9.1 | 41.9 | 41.7 | 42.0 |
| 50 | 20.9 | 20.6 | 21.1 | 9.2 | 9.0 | 9.4 | 46.0 | 45.8 | 46.1 |
| 75 | 21.2 | 21.0 | 21.3 | 9.6 | 9.3 | 9.7 | 51.6 | 51.7 | 51.5 |
| 90 | 21.4 | 21.3 | 21.5 | 9.9 | 9.7 | 10.0 | 58.5 | 58.6 | 58.3 |
| 95 | 21.6 | 21.4 | 21.7 | 10.1 | 9.9 | 10.2 | 63.0 | 62.9 | 63.3 |

Linear regression models were analyzed to quantitatively assess the comparative ability of each of the six NMR subclass/size parameters 21-26 to predict insulin resistance. The results, shown in Table 7, indicate that each of the subclass/size parameters has a statistically significant association with insulin resistance, though they differ in strengths of association. The strongest individual association was with the large VLDL-P subclass, with a 1 standard deviation increment of this parameter corresponding to a 0.29 increase in ln(HOMA). The associations of the NMR subclass/size parameters with insulin resistance are comparable to those for triglycerides and HDL-C. See, e.g., McLaughlin et al., *Use of metabolic markers to identify overweight individuals who are insulin resistant*, Ann. Intern. Med. 2003: 139: 802-9. Combining the information from a plurality of (e.g., the 6 NMR) measures into an index 50 (referred to below as a composite "LP-IR score") enhanced the association with insulin resistance substantially, with the gender-specific score performing slightly better than the non-gender-specific score.

TABLE 7

Associations of Lipids, Lipoprotein Subclass and Size Parameters, and LP-IR Index/Score with Insulin Resistance as Assessed by ln(HOMA) in Non-Diabetic Subjects in MESA (n = 4085; 1955 men; 2130 women)

| Lipid or Lipoprotein Measure | Mean (SD) | Median (IQ Range) | Δ ln(HOMA) (SE) per 1-SD | p value | Model $R^2$ |
|---|---|---|---|---|---|
| Triglycerides, mg/dL | 122 (64) | 107 (76-153) | 0.24 (0.01) | <0.0001 | 0.127 |
| HDL-C, mg/dL | 52 (15) | 49 (41-60) | −0.25 (0.01) | <0.0001 | 0.147 |
| Triglyceride/HDL-C | 2.7 (1.9) | 2.1 (1.4-3.5) | 0.28 (0.01) | <0.0001 | 0.182 |
| Large VLDL-P, nmol/L | 4.8 (5.8) | 2.4 (0.8-6.5) | 0.29 (0.01) | <0.0001 | 0.192 |
| Small LDL-P, nmol/L | 530 (392) | 507 (112-812) | 0.23 (0.01) | <0.0001 | 0.126 |
| Large HDL-P, µmol/L | 5.7 (3.3) | 4.9 (3.2-7.5) | −0.25 (0.01) | <0.0001 | 0.147 |
| VLDL Size, nm | 48.0 (7.7) | 46.3 (42.2-52.1) | 0.24 (0.01) | <0.0001 | 0.136 |
| LDL Size, nm | 20.8 (0.5) | 20.9 (20.4-21.2) | −0.22 (0.01) | <0.0001 | 0.109 |
| HDL Size, nm | 9.3 (0.5) | 9.2 (8.9-9.6) | −0.23 (0.01) | <0.0001 | 0.123 |

TABLE 7-continued

Associations of Lipids, Lipoprotein Subclass and Size Parameters, and LP-IR Index/Score with Insulin Resistance as Assessed by ln(HOMA) in Non-Diabetic Subjects in MESA (n = 4085; 1955 men; 2130 women)

| Lipid or Lipoprotein Measure | Mean (SD) | Median (IQ Range) | Δ ln(HOMA) (SE) per 1-SD | p value | Model $R^2$ |
|---|---|---|---|---|---|
| LP-IR Score[1] (0-100) | 43 (23) | 43 (25-61) | 0.34 (0.01) | <0.0001 | 0.264 |
| GS LP-IR Score[2] (0-100) | 42 (25) | 42 (21-62) | 0.34 (0.01) | <0.0001 | 0.267 |

Data are from separate unadjusted linear regression models. The strengths of association with insulin resistance are expressed as Δ ln(HOMA), the difference in ln(HOMA) associated with a 1-standard deviation increment of each lipid or lipoprotein measure. The analyses used log-transformed values of triglycerides, triglyceride/HDL-C ratio, and large VLDL-P. Median ln(HOMA) was 0.15 and values ranged from −1.97 (most insulin sensitive) to 2.43 (most insulin resistant). Model $R^2$ values give a measure of the goodness of fit of the different models (higher $R^2$ values indicating better insulin resistance prediction).
[1]Non-gender-specific LP-IR score.
[2]Gender-specific LP-IR score When only non-fasting specimens are available for analysis, it is still possible to assess insulin resistance using a modified "non-fasting" index that can omit large VLDL-P 21 and VLDL size 24 from the calculation, since these two parameters are the only ones appreciably affected by non-fasting status (both giving higher values in non-fasting versus fasting blood samples).

Figure 3A:
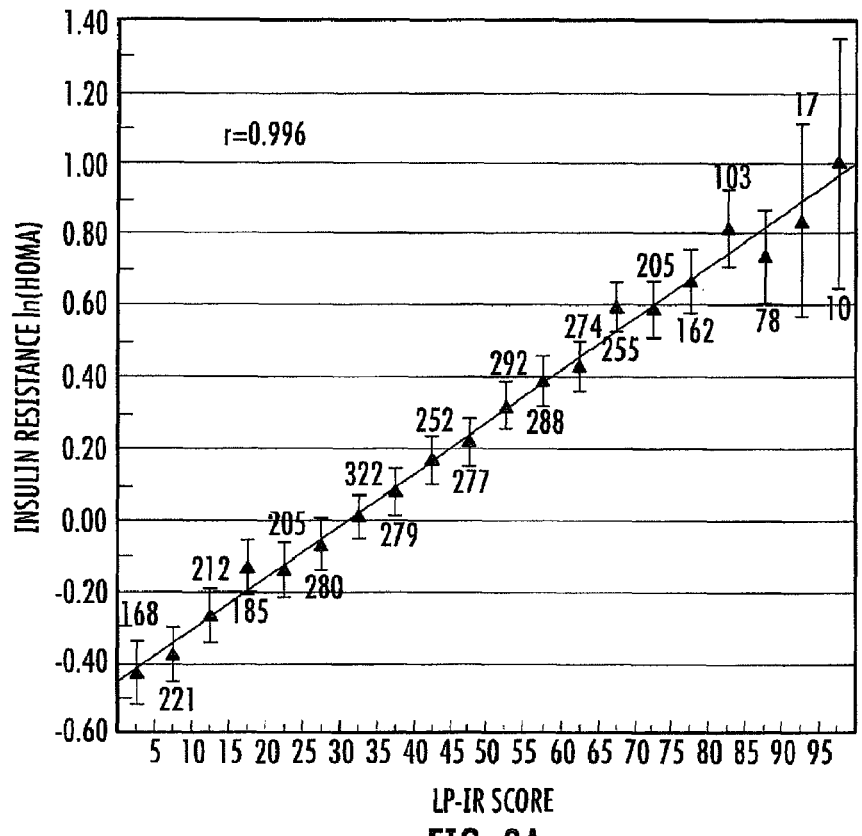
FIG. 3A is a graph of insulin resistance measured by ln(HOMA) values in non-diabetic MESA participants categorized by their lipoprotein insulin resistance index values (with the number of subjects in each index category indicted numerically) according to embodiments of the present invention.

Another measure of the performance of the lipoprotein insulin resistance index as a continuous indicator of insulin resistance is shown graphically in FIG. 3A. Plotted are the mean ln(HOMA) values and 95% confidence intervals for the non-diabetic MESA participants as a function of their (non-gender-specific) LP-IR scores. The results show a strong, linear relationship between the LP-IR score and ln(HOMA), indicating that the relative insulin sensitivity of patients can be usefully assessed using lipoprotein subclass/size information from a single (fasting) NMR LipoProfile measurement.

Figure 3B:
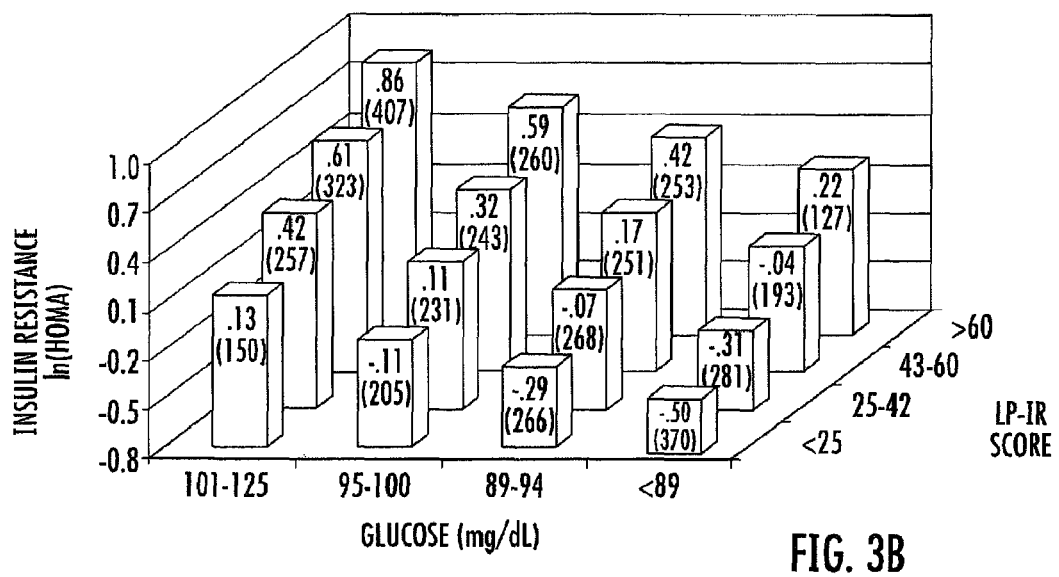
FIG. 3B is a bar graph of insulin resistance (ln(HOMA)) by quartile of glucose (mg/dL) and lipoprotein insulin resistance index score in non-diabetic MESA participants (with the number of subjects in each category indicated in parentheses) according to embodiments of the present invention.

Since fasting glucose levels are reflective of insulin resistance and are the most well-accepted indicator of a patient's risk of developing T2DM, the extent to which the index 50 (e.g., LP-IR score) adds to fasting glucose in assessing insulin resistance was examined. Mean ln(HOMA) values were determined in subgroups stratified by quartile of fasting glucose and (non-gender-specific) LP-IR score. As shown in FIG. 3B, individuals within each glucose category exhibited a range of ln(HOMA) values that were strongly associated with LP-IR score. As expected, given that glucose levels are used in the calculation of HOMA, there was also a relation of glucose level with ln(HOMA) within each LP-IR category.

Advantageously, since the NMR LipoProfile® lipoprotein test can measure the plurality (e.g., six) subclass/size lipoprotein parameters 20 simultaneously without requiring added cost, equipment or time, the information from the different parameters 20 can be combined (e.g., typically all six measures where fasting samples are analyzed while typically four measures can be combined for non-fasting samples) to predict the level or degree of insulin resistance and/or the risk of developing insulin resistance disorders including, for example, T2DM. The risk prediction can come both from the extent to which the different parameters give independent, additive prediction and/or the advantage that multiplexed information has (even if redundant) in helping overcome the limitations of prediction based on a single measurement taken at one time point. If other test techniques are used (e.g., ultra-centrifugation) where the different lipoprotein parameter data is not readily obtained, then a reduced number of lipoprotein parameters may be used.

The data indicates that the insulin sensitivity of individual patients can be accurately assessed using information obtained from a single test, such as, for example, a single NMR LipoProfile® insulin resistance test. It is believed that some patients may not be receptive to fasting tests or may not be willing to return for a test but are receptive to blood work during a planned doctor visit and the availability of a non-fasting test may be able to provide tests for those patients.

Risk assessments provided by embodiments of the invention can be routinely included in a standard overall lipoprotein profile analysis protocol for any individual undergoing a cholesterol or lipoprotein profile. Indeed, the methods of the instant invention can be conveniently and quickly automatically applied to NMR-based lipoprotein profile tests and thereby cost-effectively provide risk information, even while a patient is without symptoms. No additional blood samples are required beyond a standard cholesterol sample and the individual need not be exposed to the relatively time-consuming extended glucose tests. Such a quick and routine test can potentially allow increased numbers of now readily identifiable at-risk patients to undergo drug therapy and/or lifestyle changes to prevent the onset of insulin resistance disorders.

Figure 4:
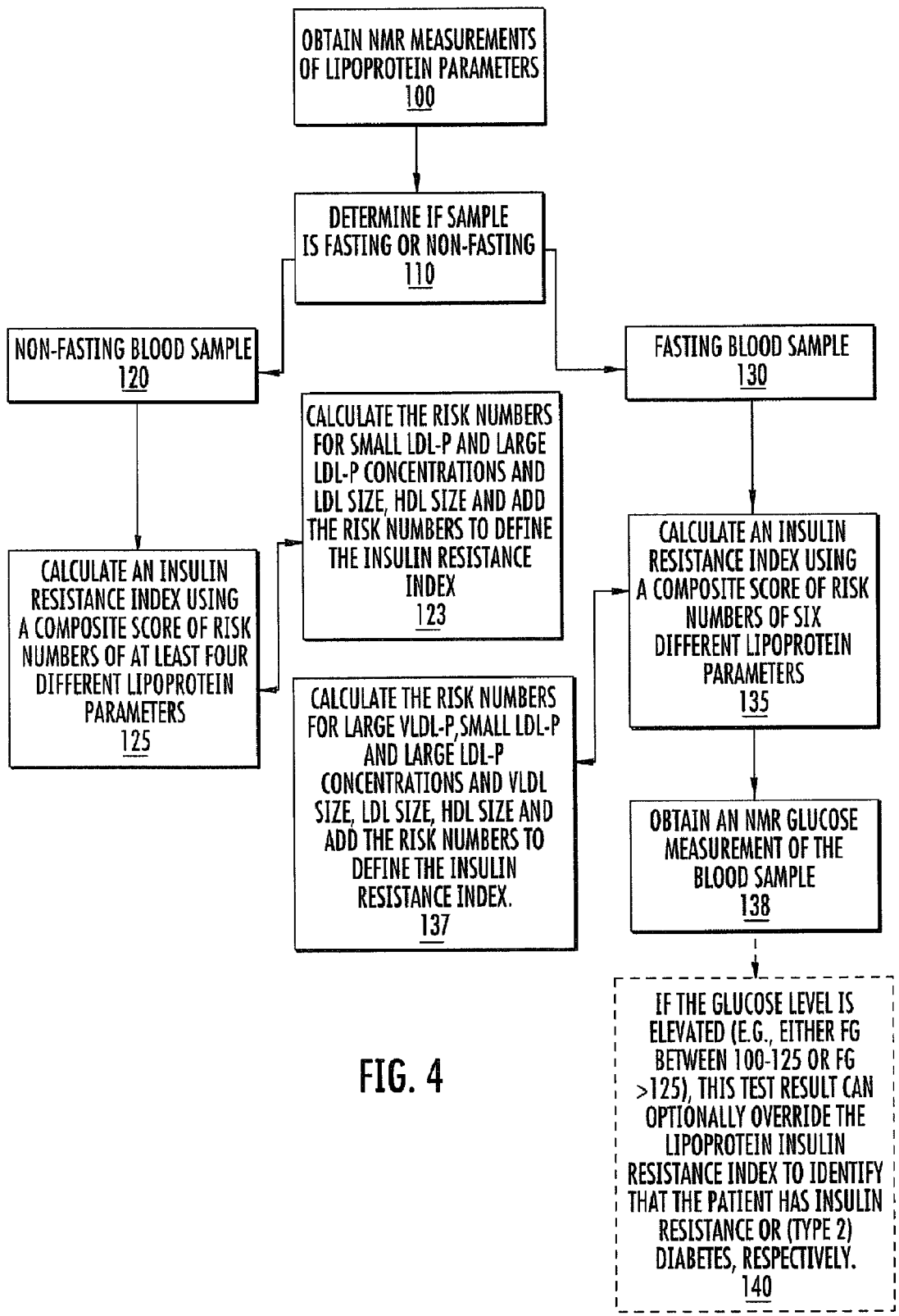
FIG. 4 is a flow chart of exemplary operations that can be carried out to determine insulin resistance indices (e.g., scores) according to embodiments of the present invention.

FIG. 4 is a flow chart of exemplary operations that can be used to carry out embodiments of the present invention. An in vitro blood sample (collected from a subject) can be obtained and introduced to an NMR analyzer (spectrometer). The subject may be suspected of being at risk for developing insulin resistance and/or Type 2 diabetes or developing insulin resistance. Alternatively, the subject may be undergoing a lipoprotein profile screening as part of an overall assessment of health or for reasons other than suspicion of being at risk for Type 2 diabetes or other insulin resistance disorder (such as screening for coronary heart disease). The blood sample may be collected according to known techniques, and may be a blood plasma sample, or a blood serum sample. The blood sample is then analyzed by NMR spectral analysis to measure lipoprotein parameters (block 100). The type of blood sample can be determined (block 110). That is, embodiments of the invention contemplate that a common NMR analyzer will be used to assess risk using both fasting and non-fasting blood samples and the samples can be identified to allow the proper test analysis. Alternatively, only one type of blood sample can be processed in a single test system, obviating the need for whether a blood sample is a fasting or non-fasting sample type. The sample type can be identified using a different color collection label or tube and associated bar code that can be input to the system to order the desired testing protocol. In some embodiments, the same testing protocol can be used for both sample types and the values that are not used for that sample type can simply be suppressed, discarded or otherwise disregarded. Thus, for a non-fasting sample, any glucose measurement (where made) and/or a VLDL-P concentration or VLDL size measurement can be optionally disregarded, e.g., not used to calculate the insulin-resistance index 50.

If the blood sample is a fasting blood sample (block 130) the insulin resistance index can be calculated using a composite score that adds the risk scores 40 of a plurality of (typically all six) different lipoprotein parameters 20 (block 135). An NMR glucose measurement can also be obtained (block 138). In particular embodiments, the risk numbers for concentrations of large VLDL-P, small LDL-P and large HDL-P and VLDL size, LDL size and HDL size can be determined and added together to define the insulin resistance index 50 (block 137). Optionally, if the glucose level is elevated, e.g., at or above 90 mg/dL (e.g., either FG between 100-125 mg/dL or FG>125 mg/dL) this glucose test result can override the index 50 or buttress the risk associated with the index 50 to identify that the patient is likely to have insulin resistance disorders and/or T2DM (block 140). Where used, the glucose measurement can be considered and for a FG<90 mg/dL value or a value that is less than about 100 mg/dL, this measurement can confirm that the patient is insulin sensitive (before the onset of undue insulin resistance or pre-diabetes).

If the blood sample is a non-fasting blood sample (block 120) the insulin resistance index 50 can be calculated using a composite score that adds the risk numbers of a plurality (typically four) of different lipoprotein parameters that is less than the parameters used for the fasting analysis (block 125). The risk scores 40 for concentrations of small LDL-P and large HDL-P and LDL size and HDL size can be determined and added together to define the (composite) insulin resistance index 50 (block 123).

It is contemplated that other or additional lipoprotein parameters with associated risk scores can be added together for either the fasting or non-fasting samples to generate the insulin resistance index and/or that the risk scores 40 for one or more of the parameters 20 may be weighted in the index calculation.

In some embodiments, the testing system/method can be configured to identify whether a patient is on any lipid altering medications, e.g., (whether a non-diabetic patient is taking the lipid altering medications). This can allow the system/method to calculate the index with a different set of the six lipoprotein parameters (and adjusted maximum score) or weight the parameters 40 or use alternate risk scores 30, e.g., analyze the sample differently than the analysis used for other samples. For example, for a patient taking statins, the risk score may be calculated the same as for other patients or the index may be calculated by excluding the concentration of small LDL particles (and reducing the overall potential index number).

In some embodiments, the index 50 can be calculated in alternate ways and provided to a clinician. Similar adjustments in the total index score possible and/or which of the six lipoprotein parameters 20 to exclude or to adjust the associated risk scores 30 can be based on medication that the patient is taking and what lipid alterations are associated with same.

As is known, because the observed $CH_3$ lineshapes of whole plasma samples are closely simulated by the appropriately weighted sum of lipid signals of its constituent lipoprotein classes, it is possible to extract the concentrations of these constituents present in any sample. This is accomplished by calculating the weighting factors which give the best fit between observed blood plasma NMR spectra and the calculated blood plasma spectra. Generally speaking, the process of NMR lipoprotein analysis can be carried out by the following steps: (1) acquisition of an NMR "reference" spectrum for each of the "pure" individual or related groupings of constituent lipoprotein classes and/or subclasses of plasma of interest, (2) acquisition of a whole plasma NMR spectrum for a sample using measurement conditions substantially identical to those used to obtain the reference spectra, and (3) computer deconvolution of the plasma NMR spectrum in terms of the constituent classes and/or subclasses (or related groupings thereof) to give the concentration of each lipoprotein constituent expressed as a multiple of the concentration of the corresponding lipoprotein reference.

As used herein, the term "NMR spectral analysis" means using proton ($^1H$) nuclear magnetic resonance spectroscopy techniques to measure the lipoprotein parameters present in blood plasma or blood serum, or to measure the concentration or "level" of glucose present in blood plasma or blood serum. "Measuring" a lipoprotein parameter (class or subclass) refers to determining a parameter of the lipoprotein class or subclass, such as the concentration of the lipoprotein class or subclass or the average particle size thereof.

More specifically, particular embodiments of the invention include systems and methods that acquires proton NMR data from a sample of blood plasma or serum, processes the acquired NMR data to produce a chemical shift spectrum, and deconvolutes the spectrum in terms of the reference spectra of subclasses of the major classes of lipoprotein to give the concentration of each of the lipoprotein constituents and the distribution of subclasses of the constituents. The systems and methods may optionally also acquire proton NMR data from a sample of blood plasma or serum, process the acquired NMR data to produce a chemical shift spectrum, and deconvolute the spectrum in terms of the reference spectrum of glucose to give the concentration of glucose in the blood serum or blood plasma sample.

Although the procedure can be carried out on lipoprotein classes, carrying out the process for subclasses of lipoproteins can decrease the error between the calculated lineshape and the NMR lineshape, thus increasing the accuracy of the measurement while allowing for simultaneous determination of the subclass profile of each class. Because the differences in subclass lineshapes and chemical shifts are small, it is typically important to correctly align the reference spectrum of each subclass with the plasma spectrum. The alignment of these spectra is accomplished by the alignment of control peaks in the spectra, which are known to respond in the same manner to environmental variables, such as temperature and sample composition, as do the lipoprotein spectra. One such suitable alignment peak is the peak produced by CaEDTA, although other EDTA peaks or suitable peak may be utilized. By alignment of the spectra, the small variations in the subclasses' lineshapes and chemical shifts may be exploited to produce higher accuracy and subclass profiles. Further description of deconvolving methods for NMR signals can be found in U.S. Pat. Nos. 4,933,844; 5,343,389; and 7,243,030, the contents of which are hereby incorporated by reference as if recited in full herein.

Thus, in some typical embodiments, the concentrations and sizes of the lipoprotein parameters of interest are determined by acquiring reference spectra of individual lipoprotein classes and/or subclasses. The reference spectra are then stored, such as in electronic memory and/or a computer program, to provide a reference basis for evaluating additional blood samples or serum samples. The NMR spectroscopy-derived spectra associated with the individual lipoprotein classes and subclasses are substantially invariant across the population. As such, the NMR reference spectra (lineshapes and amplitudes) of individual lipoprotein constituents can be used as a "key" to "deconvolute" the composite signal associated with an individual's whole blood plasma (or blood serum). In this way, a single reference set can be used as a basis to determine the lipoprotein profile of other blood samples (when taken at a substantially constant temperature and magnetic field).

More particularly stated, one embodiment of the present invention assigns a scalable coefficient to the individual reference constituent standards and takes the sums of the scalable (weighted) individual constituent parameters. An NMR spectroscopy analysis is generated for a desired blood plasma or serum specimen (taken at the same magnetic field strength and temperatures used for the reference spectra) to provide an actual (measured) composite blood plasma spectra signal. The preferred method of the present invention then manipulates the scalable reference spectra until the sum of the scalable coefficients substantially "fits" the composite signal value. The value of the scalable coefficient is then used to determine the actual concentration values for the lipoprotein constituents in the blood plasma sample of that individual.

In addition to determining parameters of the lipoprotein classes and/or subclasses, the NMR spectral analysis of the present invention may also be used to measure the parameters of other constituents of blood such as the concentration of triglycerides, protein, and chylomicrons in the blood sample.

As discussed above, in some embodiments, the concentration of glucose in a blood sample of the invention can be measured, typically also using NMR spectral analysis concurrently with the NMR-based measurement of the lipoprotein values in the same blood sample. As used herein, the word "concurrently" means sufficiently close in time to be able to be performed during one NMR "run" or measurement event (that is, "concurrently" may be simultaneously, or it may be two or more events occurring within a short time period before or after each other, or it may be an NMR evaluation performed on the same sample, or samples taken from the patient in a single blood withdraw session, or samples taken from a single venipuncture once patency is established).

Patients with moderately elevated fasting glucose levels are at an increased risk of developing Type 2 diabetes. Accordingly, embodiments of the invention can allow for the determination of the concentration of glucose in a sample of blood plasma by $^1$H NMR spectral analysis. This is done by comparing the $^1$H-NMR spectrum of the sample to the spectrum of a sample with a known glucose concentration. By comparing the difference in intensities of the sample spectra, the concentration of glucose in the spectrum can be calculated.

Figure 5:
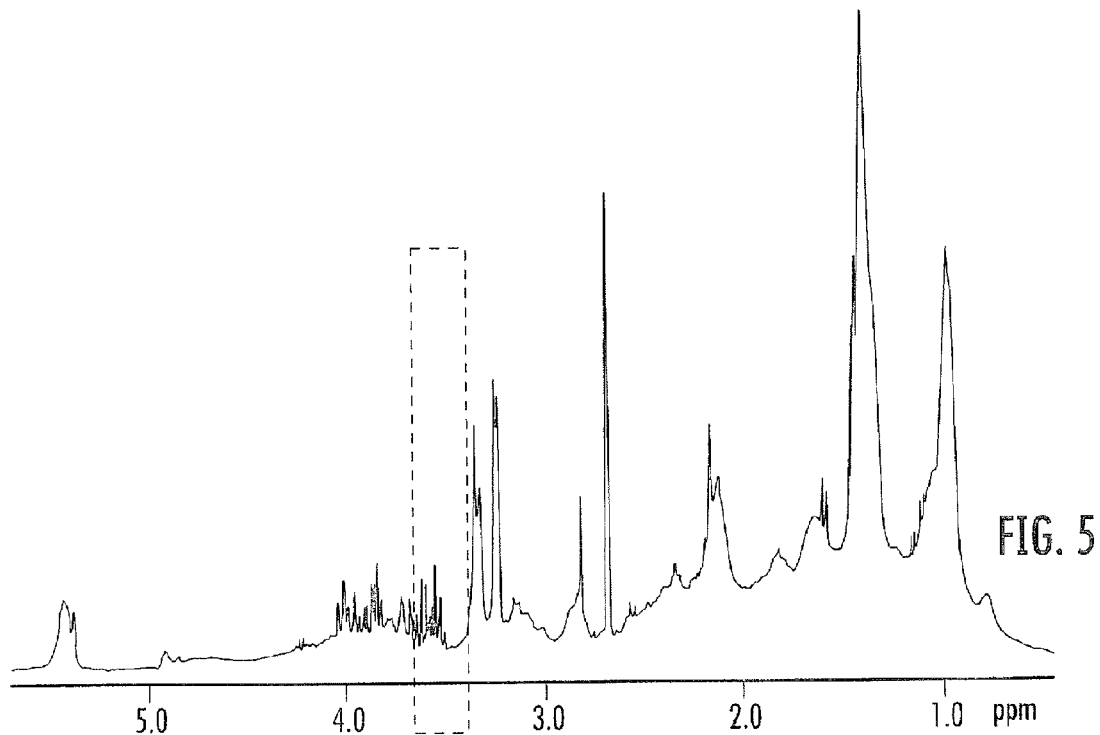
FIG. 5 is a proton NMR spectrum of blood plasma, with a glucose fitting region indicated by the broken-line box according to some embodiments of the present invention.
Figure 6:
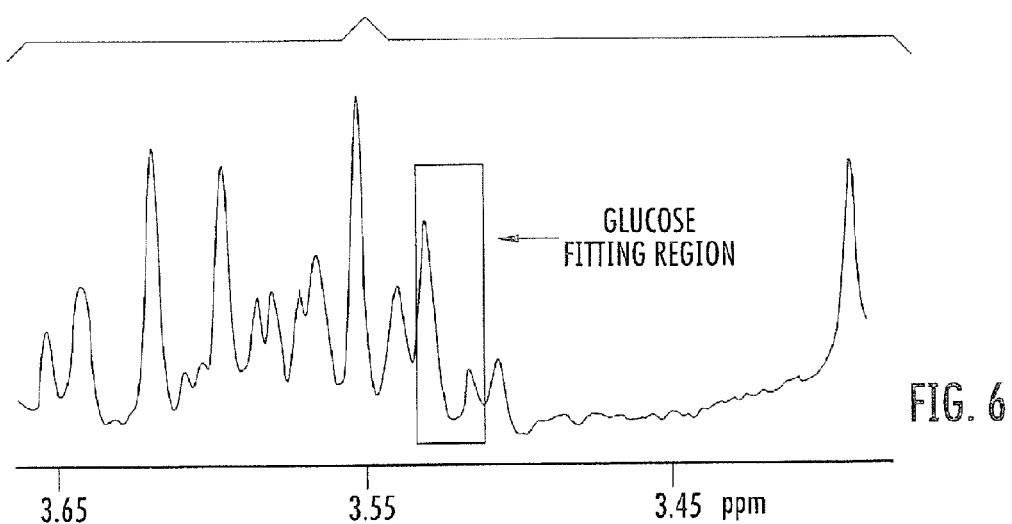
FIG. 6 is an enlarged partial NMR spectrum of FIG. 5 showing the glucose fitting region enlarged with two peaks used to assess glucose level in patients according to embodiments of the present invention.

FIG. 5 shows the proton NMR spectrum of blood plasma, with a glucose fitting region with two peaks between about 3.55-3.50 (ppm) in the proton NMR spectrum that can be used to determine the glucose level. FIG. 6 shows an expansion of the region of the blood plasma spectrum where glucose signals are observed, the two peaks being specifically indicated within the glucose fitting region. The peaks in the glucose fitting region may be used for the quantitative determination of glucose according to embodiments of the present invention. The data points in the reference or standard spectrum and patient glucose sample spectra are aligned using a line-shape fitting process as described herein to find the "best fit," and the intensity of the standard spectrum is scaled to match the sample spectrum. The glucose concentration of the standard is multiplied by the scaling factor used to match the sample lineshape to give the glucose concentration of the blood sample.

Stated differently, in this glucose measurement method, an NMR reference data spectrum corresponding to glucose in a reference blood plasma or serum sample or specimen is acquired and stored in computer memory. A reference coefficient is assigned to one glucose signal or group of glucose signals ("reference glucose lineshape") in the reference spectrum, the value of which is based on the glucose concentration of that reference specimen determined by an independent chemical glucose measurement. An NMR spectrum of a patient's blood plasma or serum specimen is acquired at some later time under measurement conditions (substantially) identical to those used to obtain the glucose reference spectrum and stored in computer memory. That is, for example, the NMR data spectrums are obtained under the same magnetic field strength and specimen temperature. The reference glucose lineshape is compared with the same glucose signal or group of signals in the patient spectrum ("patient glucose lineshape"). A calculation is then performed which determines the scaling factor needed to adjust the amplitude of the reference glucose lineshape to give the best match with the patient glucose lineshape. This scaling factor is multiplied by the reference coefficient to give the concentration of glucose in the patient blood plasma or serum specimen.

The mathematics used in the lineshape fitting process (i.e., least squares fit of an unknown function in terms of a weighted sum of known functions) is well known and is described in many textbooks of numerical analysis such as F. B. Hildebrand, *Introduction to Numerical Analysis,* 2nd edition, pp. 314-326, 539-567, McGraw-Hill, 1975. Additional description of glucose computation is provided in U.S. Pat. No. 6,518,069 to Otvos et al., the contents of which are hereby incorporated by reference as if recited in full herein.

Other lifestyle and genetic information can also be acquired and factored into an overall risk assessment analysis by the clinician. For example, weight, age, and family history of diabetes can all be assigned risk values which can be factored (separately or with) into the blood lipoprotein based analysis.

A subject may have a borderline (blood test) insulin resistance index 50 (e.g, a value that is between 50%-60% of the maximum risk number), but may be identified as being "at-risk" (i.e., for developing Type 2 diabetes) by the increased risk values attributed to one or more of familial, genetic, weight or lifestyle information. This information may then identify the subject for lifestyle changes such as exercise, weight loss or diet changes and/or drug therapy and/or place the subject on an increased and/or timed monitoring schedule. As noted above, the index 50 may provide more tangible evidence of metabolic abnormality that can be used to motivate a patient to make lifestyle changes.

It will be understood by those skilled in the art that the methods described herein are useful for evaluating a patient over time (and potentially efficacy of a treatment program) for decreasing the insulin insensitivity or insulin resistance risk. A baseline insulin resistance/sensitivity test generating a baseline insulin resistance index 50 can be obtained by analyzing the patient sample, e.g., typically a blood sample analyzed by NMR spectral analysis as described herein. After the baseline test, and periodically thereafter, blood or another suitable biosample can be collected again from the subject, and a second and subsequent insulin resistance analysis of the lipoprotein parameters that were measured in the baseline is then obtained, again typically by NMR spectral analysis, as described herein. The second analysis and/or index 50 can be compared to the baseline index 50. A difference between the two (as indicated by a difference in the index 50 and/or a beneficial/favorable change in the value of one or more measured lipoprotein particle parameters 20) may provide an indication of the efficacy of treatment and/or stability in the index 50.

Figure 7:
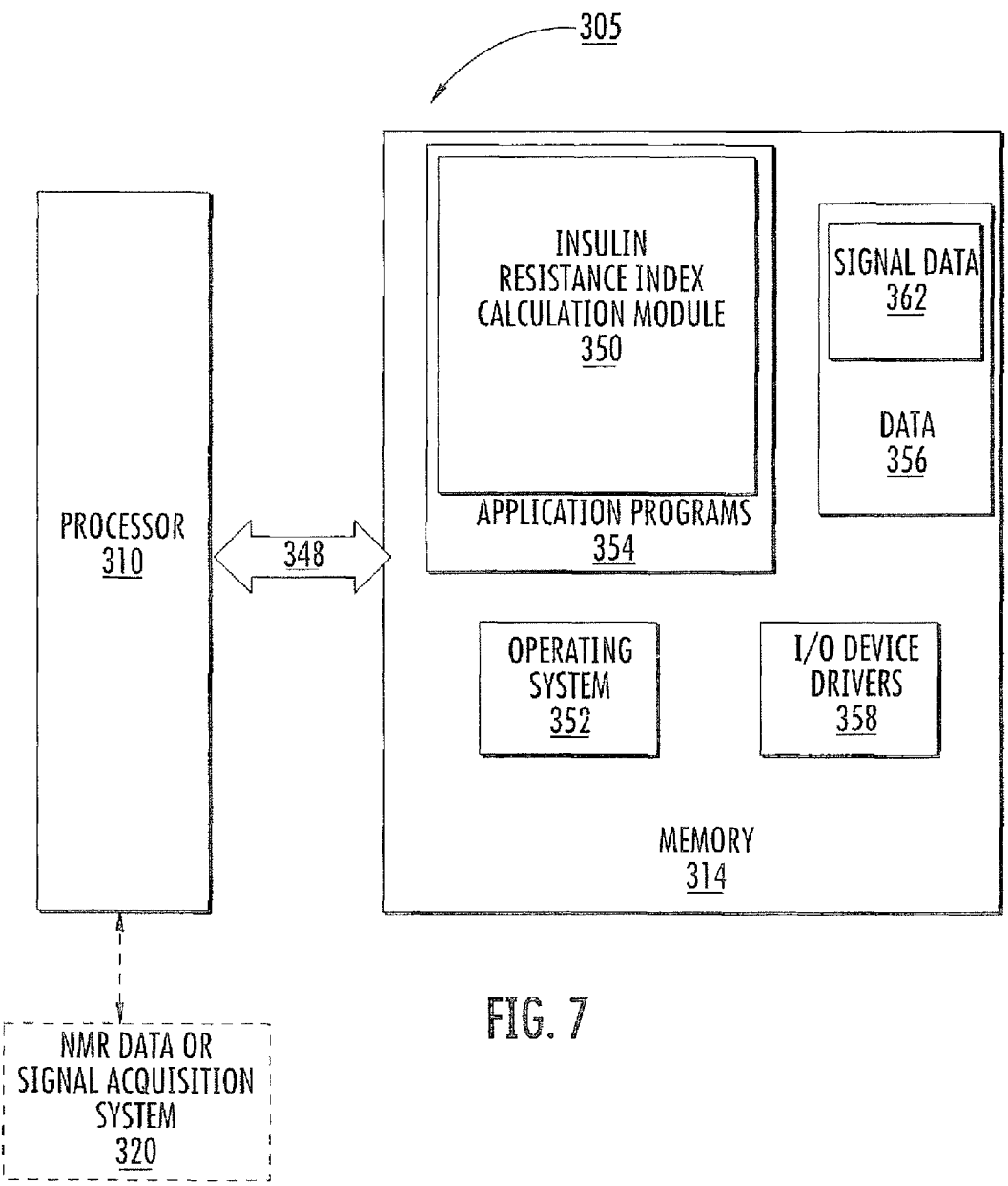
FIG. 7 is a schematic illustration of a data processing system according to embodiments of the present invention.

FIG. 7 is a block diagram of exemplary embodiments of data processing systems that illustrates systems, methods, and computer program products in accordance with embodiments of the present invention. The processor 310 communicates with the memory 314 via an address/data bus 348. The processor 310 can be any commercially available or custom microprocessor. The memory 314 is representative of the overall hierarchy of memory devices containing the software and data used to implement the functionality of the data processing system 305. The memory 314 can include, but is not limited to, the following types of devices: cache, ROM, PROM, EPROM, EEPROM, flash memory, SRAM, and DRAM.

As shown in FIG. 7, the memory 314 may include several categories of software and data used in the data processing system 305: the operating system 352; the application programs 354; the input/output (I/O) device drivers 358; an Insulin Resistance Index Calculation Module that considers concentrations and sizes of lipoprotein parameters 350; and the data 356. The Insulin Resistance Index Calculation Module 350 can include predefined risk values for different values or ranges of each lipoprotein parameter acting as a marker "20" (a defined lipoprotein particle parameter that is associated with insulin resistance) in a look-up chart or electronic reference library.

The data 356 may include signal (constituent and/or composite spectrum lineshape) data 362 which may be obtained from a data or signal acquisition system 320. As will be appreciated by those of skill in the art, the operating system 352 may be any operating system suitable for use with a data processing system, such as OS/2, AIX or OS/390 from International Business Machines Corporation, Armonk, N.Y., WindowsCE, WindowsNT, Windows95, Windows98, Windows2000 or WindowsXP from Microsoft Corporation, Redmond, Wash., PalmOS from Palm, Inc., MacOS from Apple Computer, UNIX, FreeBSD, or Linux, proprietary operating systems or dedicated operating systems, for example, for embedded data processing systems.

The I/O device drivers 358 typically include software routines accessed through the operating system 352 by the application programs 354 to communicate with devices such as I/O data port(s), data storage 356 and certain memory 314 components and/or the image acquisition system 320. The application programs 354 are illustrative of the programs that implement the various features of the data processing system 305 and can include at least one application, which supports operations according to embodiments of the present invention. Finally, the data 356 represents the static and dynamic data used by the application programs 354, the operating system 352, the I/O device drivers 358, and other software programs that may reside in the memory 314.

While the present invention is illustrated, for example, with reference to the Module 350 being an application program in FIG. 7, as will be appreciated by those of skill in the art, other configurations may also be utilized while still benefiting from the teachings of the present invention. For example, the Module 350 may also be incorporated into the operating system 352, the I/O device drivers 358 or other such logical division of the data processing system 305. Thus, the present invention should not be construed as limited to the configuration of FIG. 7, which is intended to encompass any configuration capable of carrying out the operations described herein.

The I/O data port can be used to transfer information between the data processing system 305 and the image scanner or acquisition system 320 or another computer system or a network (e.g., the Internet) or to other devices controlled by the processor. These components may be conventional components such as those used in many conventional data processing systems, which may be configured in accordance with the present invention to operate as described herein.

While the present invention is illustrated, for example, with reference to particular divisions of programs, functions and memories, the present invention should not be construed as limited to such logical divisions. Thus, the present invention should not be construed as limited to the configuration of FIG. 7 but is intended to encompass any configuration capable of carrying out the operations described herein.

Figure 8:
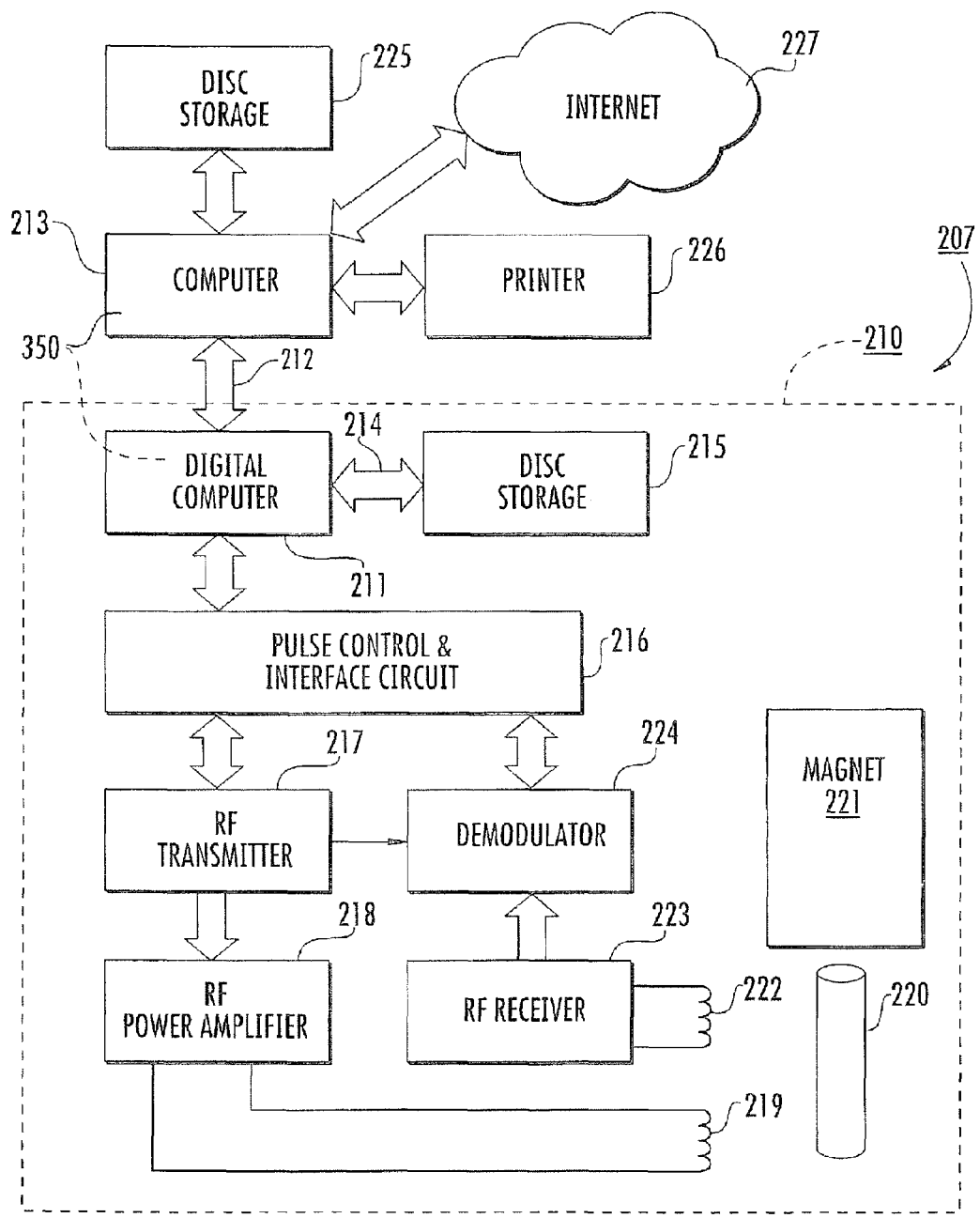
FIG. 8 is a schematic illustration of an NMR analyzer according to embodiments of the present invention.

Referring now to FIG. 8, a schematic of an exemplary system 207 for acquiring and calculating the lineshape and/or NMR measurements of a selected sample is illustrated. The system 207 includes an NMR spectrometer 210 for taking NMR measurements of a sample. In one embodiment, the spectrometer 210 is configured so that the NMR measurements are conducted at 400 MHz for proton signals; in other embodiments the measurements may be carried out at 360 MHz or other suitable frequency. Other frequencies corresponding to a desired operational magnetic field strength may also be employed. Typically, a proton flow probe is installed, as is a temperature controller to maintain the sample temperature at 47+/−0.2 degrees C. Field homogeneity of the spectrometer 210 can be optimized by shimming on a sample of 99.8% $D_2O$ until the spectral linewidth of the HDO NMR signal is less than 0.6 Hz. The 90° RF excitation pulse width used for the $D_2O$ measurement is typically ca. 6-7 microseconds.

Referring again to FIG. 8, the spectrometer 210 is controlled by a processor or an ACIS typically held in a digital computer 211 or other signal processing unit. The computer/processor should be capable of performing rapid Fourier transformations. The system 207 may also include a data link 212 to an external server, client or other computer 213, and a direct-memory-access channel 214 which connects to a hard disc unit 215 or back-up server with data storage.

The computer 211 may also include a set of analog-to-digital converters, digital-to-analog converters and slow device I/O ports which connect through a pulse control and interface circuit 216 to the operating elements of the spectrometer. These elements include an RF transmitter 217 which produces an RF excitation pulse of the duration, frequency and magnitude directed by the digital computer 211, and an RF power amplifier 218 which amplifies the pulse and couples it to the RF transmit coil 219 that surrounds sample cell 220. The NMR signal produced by the excited sample in the presence of a 9.4 Tesla polarizing magnetic field produced by superconducting magnet 221 is received by a coil 222 and applied to an RF receiver 223. The amplified and filtered NMR signal is demodulated at 224 and the resulting quadrature signals are applied to the interface circuit 216 where they are digitized and input through the digital computer 211 to a file in the disc storage 215. The module 350 (FIG. 7) can be located in the digital computer 211 and/or in a secondary computer, processor, or database that may be on-site or remote with a wired or wireless connection. The system 207 can have Internet connectivity 227 and can send reports to clinicians electronically and/or via paper. Additional automated clinical NMR analyzer systems suitable for analyzing biosamples or specimens are described in co-pending, co-assigned U.S. patent application Ser. No. 11/093,596 (2005-0222504), the contents of which are hereby incorporated by reference as if recited in full herein. See also, U.S. Pat. Nos. 5,343,389, 6,617,167, 4,933,844, and 7,243,030, for additional description of this analytical technique. The contents of these patent documents are hereby incorporated by reference as if recited in full herein. See also Handbook of Lipoprotein Testing, Chapter 31: "Measurement of lipoprotein subclass profiles by nuclear magnetic resonance spectroscopy", J. D. Otvos, AACC Press, Washington D.C., 2000, 2nd ed., pp 609-623.

After the NMR data are acquired from the sample in the measurement cell 220, processing by the computer 211 produces another file that can, as desired, be stored in the disc storage 215 (or other data storage device such as a server or database). This second file is a digital representation of the chemical shift spectrum and it is subsequently read out to the computer 213 for storage in its disc storage 225. Under the direction of a program stored in its memory or a remote system, the computer 13, which may be personal, laptop, desktop, or other computer, processes the chemical shift spectrum in accordance with the teachings of the present invention to print a report, which is output to a printer 226 or electronically stored and relayed to a desired email address or URL. Those skilled in this art will recognize that other output devices, such as a computer display screen, may also be employed for the display of results.

It should be apparent to those skilled in the art that the functions performed by the computer 213 and its separate disc storage 225 may also be incorporated into the functions performed by the spectrometer's digital computer 211. In such case, the printer 226 may be connected directly to the digital computer 211 or may reside at a clinician site. Other interfaces and output devices may also be employed, as are well-known to those skilled in this art.

It is contemplated that the insulin resistance index may help identify patients that are at-risk for having disorders of insulin resistance including, but not limited to, dyslipidemia, (including diabetic dyslipidemia) Type 2 diabetes, and gestational diabetes.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses, where used, are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of predicting a non-diabetic subject's degree of insulin resistance, comprising:
   obtaining measurements of a plurality of selected lipoprotein parameters from an in vitro patient biosample;
   programmatically providing a risk score for each obtained measurement of the selected lipoprotein parameters; and
   programmatically generating a lipoprotein insulin resistance index based on the obtained measurements, wherein the lipoprotein insulin resistance index is generated by summing the risk scores for each of the selected lipoprotein parameters to generate a composite numerical score, and wherein the insulin resistance index comprises the composite numerical score.

2. A method according to claim 1, wherein the selected lipoprotein parameters include at least four of the following: large VLDL, small LDL, and large HDL particle concentrations and VLDL, LDL, and HDL particle sizes.

3. The method of claim 1, wherein the patient's biosample is a non-fasting blood plasma or serum sample, and wherein the obtained measurements include at least measurements of small LDL and large HDL particle concentrations and the average LDL and HDL particle sizes, and wherein the risk scores are calculated or selected from a set of defined risk scores for each of the at least four obtained measurements, and the summed risk scores for the composite numerical score of the insulin resistance index are at least four risk scores one for each of the measurements for the small LDL and large HDL particle concentrations and the average LDL and HDL particle sizes to generate the insulin resistance index.

4. The method of claim 2, wherein the patient's biosample is a fasting blood plasma or serum sample, wherein the selected lipoprotein parameters include all six of the lipoprotein parameters, and wherein respective risk scores associated with the six selected lipoprotein parameters are summed to generate the insulin resistance index.

5. The method of claim 1, wherein the generating step comprises (a) selecting a risk score from a set of defined risk scores for each respective risk score or (b) calculating a risk score for each of the obtained lipoprotein parameter measurements, wherein the insulin resistance index has a value between 0-100, with "100" indicating a high degree of insulin resistance and "0" indicating insulin sensitivity.

6. The method of claim 1, wherein respective risk scores are selected from a set of defined risk scores for each lipoprotein parameter, with the set of risk scores being associated with different potential measurement values or ranges of values of each of the selected lipoprotein parameters, with the defined risk scores in each set of risk scores increasing in value for each lipoprotein parameter according to increasing risk of insulin resistance for the corresponding potential measurement values or range of values.

7. The method of claim 1, wherein the obtained measurements are NMR-derived measurements.

8. The method of claim 1, further comprising measuring a glucose level in the biosample using an NMR evaluation of the patient sample.

9. The method of claim 1, wherein the plurality of selected lipoprotein parameters is at least four, and wherein the risk score for each lipoprotein parameter is selected from a set of risk scores, the set of risk scores being correlated to defined different ranges of measurement values for each of the at least four lipoprotein parameters.

10. The method of claim 9, wherein the risk scores of at least two of the lipoprotein particle parameters are different for male and female patients.

11. A patient test report, comprising:
   a lipoprotein insulin resistance index, wherein the insulin resistance index is determined based on defined risk scores associated with measured values of a plurality of defined lipoprotein parameters obtained from a biosample of the patient, the defined lipoprotein parameters each having a risk of association of insulin resistance and include at least a plurality of large VLDL, small LDL, and large HDL particle concentrations and VLDL, LDL, and HDL particle sizes, wherein the lipoprotein insulin resistance index is a score in a defined numerical range, with a lowest number in the defined range associated with most insulin sensitivity and a highest number in the defined range associated with most insulin resistance.

12. The patient test report of claim 11, wherein the lipoprotein insulin resistance index is a score in a defined numerical range, with the range being one of the following: about 0-10, about 0-24, about 0-25, about 0-50, about 0-100, about 0-200, or about 0-1000, wherein the about "0" end of the range is associated with insulin sensitivity and a highest number in each range is associated with most insulin resistance.

13. The patient test report of claim 11, wherein the lipoprotein insulin resistance index is a score that ranges between about 0-100 with about "0" being associated with most insulin sensitivity and about "100" being associated with most insulin resistance and a high degree of risk of developing Type 2 diabetes.

14. A patient test report, comprising:
a lipoprotein insulin resistance index, wherein the insulin resistance index is a composite number of summed risk scores of NMR-measured lipoprotein particle parameters of a patient blood or plasma sample.

15. The patient test report of claim 14, wherein the index is a composite number of summed risk scores of at least four of the following NMR-measured lipoprotein particle parameters, including at least four of the following:
large VLDL, small LDL, and large HDL particle concentrations and VLDL, LDL, and HDL particle sizes.

16. The patient test report of claim 14, wherein the index is calculated using a non-fasting patient sample.

17. The patient test report of claim 14, wherein the index is calculated using a fasting patient sample, and wherein the at least four lipoprotein particle parameters is all six of the lipoprotein particle parameters.

18. The patient test report of claim 14, wherein the lipoprotein insulin resistance index comprises a numerical score in a defined numerical range, with a lowest number in the defined range associated with most insulin sensitivity and a highest number in the defined range associated with most insulin resistance.

19. The patient test report of claim 18, wherein the test report also includes a cardiovascular risk analysis segment which indicates the patient's risk of developing cardiovascular disease based on NMR measurements of LDL and HDL particles.

20. The patient test report of claim 14, wherein the lipoprotein insulin resistance index is a score that ranges between about 0-100, with about "0" being associated with most insulin sensitivity and about "100" associated with most insulin resistance and a high degree of risk of developing Type 2 diabetes.

21. The patient test report of claim 18, wherein the test report includes a lipoprotein insulin index scale that visually indicates whether the score is associated with a low level of insulin resistance (insulin sensitivity) or a high level of insulin resistance.

22. A computer program for assessing decreased insulin sensitivity and/or insulin resistance, the computer program comprising:
a non-transitory computer readable storage medium having computer readable program code in said medium for causing one or more computer processors to perform, said computer-readable program code comprising:
computer readable program code that determines NMR measurements of at least four of the following lipoprotein parameters: large VLDL, small LDL, and large HDL particle concentrations and VLDL, LDL, and HDL particle sizes;
computer readable program code that associates a risk score to each of the at least four lipoprotein NMR measurements; and
computer readable program code that sums the risk scores of each of the at least four NMR lipoprotein parameter measurements to generate a lipoprotein insulin resistance index score.

23. The computer program of claim 22, wherein the patient's sample is a non-fasting sample, wherein the computer readable program code that determines the NMR measurements determines the measurements of the small LDL and large HDL particle concentrations and the average LDL and HDL particle sizes.

24. The computer program of claim 22, wherein the patient's sample is a fasting sample, wherein the computer readable program code that determines measurements is configured to determine NMR measurements of all six of the lipoprotein parameters, and wherein the computer readable program code that generates the lipoprotein insulin resistance index is configured to calculate the index using a summation of a discrete risk score associated with each of the lipoprotein parameter measurements.

25. A system for generating an insulin resistance index using measurement data of lipoprotein parameters, comprising:
an NMR spectrometer for acquiring at least one NMR spectrum of an in vitro blood plasma or serum sample of a subject; and
at least one processor in communication with the NMR spectrometer, the processor configured to: (a) determine NMR measurements of a plurality of selected lipoprotein parameters in the blood plasma or serum sample (b) calculate a risk score or select a risk score from a set of defined risk scores for each of the determined measurements of the selected lipoprotein parameters; and (c) generate an insulin resistance index using the risk scores of each of the selected lipoprotein parameters.

26. The system of claim 25, wherein the selected lipoprotein parameters include at least four of the following lipoprotein parameters: large VLDL, small LDL, and large HDL particle concentrations and VLDL, LDL, and HDL particle sizes.

27. A system according to claim 25, wherein the system is configured to run both fasting and non-fasting samples, and wherein the system is electronically configured to generate the insulin resistance index differently depending on whether the sample is a fasting sample or a non-fasting sample.

28. A system according to claim 25, wherein the processor is further configured to determine an NMR measurement of glucose of the patient's blood plasma or serum sample.

29. A method of evaluating a subject for a change in insulin resistance, comprising:
programmatically generating a first insulin resistance index that is determined using a summation of discrete risk scores for each of a plurality of defined NMR measured lipoprotein parameters for a patient's blood plasma or serum sample, including at least a plurality of the following lipoprotein parameters: large VLDL, small LDL, and large HDL particle concentrations and VLDL, LDL, and HDL particle sizes, wherein the risk score for each lipoprotein parameter is selected from a defined set of risk numbers correlated to different measurement ranges; then
programmatically generating a second insulin resistance index at a different time that is determined using a summation of corresponding discrete risk scores for each of the plurality of defined NMR measured lipoprotein parameters for another blood plasma or serum sample of the patient; and comparing the first index and the second index to assess whether the patient has a change in value of the lipoprotein insulin resistance index to thereby provide an indication of the efficacy of any lifestyle changes or treatment for the subject.

* * * * *